(12) United States Patent
Lee et al.

(10) Patent No.: US 8,329,486 B2
(45) Date of Patent: Dec. 11, 2012

(54) THIN FILM TRANSISTOR ARRAY PANEL AND METHOD FOR MANUFACTURING THE SAME

(75) Inventors: Yun-Seok Lee, Chungcheongnam-do (KR); Young-Je Cho, Chungcheongnam-do (KR); Sung-Hoon Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 752 days.

(21) Appl. No.: 12/472,979

(22) Filed: May 27, 2009

(65) Prior Publication Data

US 2010/0109007 A1   May 6, 2010

(30) Foreign Application Priority Data

Nov. 5, 2008   (KR) .................. 10-2008-0109512

(51) Int. Cl.
  *H01L 21/00*   (2006.01)
(52) U.S. Cl. ................ 438/30; 438/29; 257/E33.053; 257/83; 257/84
(58) Field of Classification Search ............ 438/29, 438/30; 257/84, 83, E33.053
  See application file for complete search history.

(56) References Cited

FOREIGN PATENT DOCUMENTS

| | | |
|---|---|---|
| JP | 2000-181077 | 6/2000 |
| KR | 2004-0048757 | 6/2004 |
| KR | 2005-0003498 | 1/2005 |
| KR | 2005-0029876 | 3/2005 |
| KR | 2005-0067942 | 7/2005 |
| KR | 2006-0011414 | 2/2006 |
| KR | 2006-0051746 | 5/2006 |
| KR | 2007-0002388 | 1/2007 |
| KR | 2007-0019454 | 2/2007 |
| KR | 2007-0080476 | 8/2007 |
| KR | 2007-0095549 | 10/2007 |

*Primary Examiner* — Bradley K Smith
*Assistant Examiner* — Amar Movva
(74) *Attorney, Agent, or Firm* — Innovation Counsel LLP

(57) ABSTRACT

The present disclosure relates to a thin film transistor array panel and a manufacturing method thereof. The method comprises: forming a thin film transistor on a substrate; forming a color filter adjacent to the thin film transistor and over the same substrate; depositing a first passivation layer on the color filter; coating a photosensitive film on the first passivation layer and exposing the photosensitive film to light using a first photomask to form a first photosensitive film pattern that comprises a first portion and a second portion that is thicker than the first portion, the first photosensitive film pattern exposing the first passivation layer around a circumference of the second portion; removing the exposed first passivation layer using the first photosensitive film pattern as an etch mask; blanket etching a whole surface of the first photosensitive film pattern until the first portion is removed to form a second photosensitive film pattern; depositing a conductive layer on the second photosensitive film pattern; and removing the second photosensitive film pattern to thereby selectively lift off portions of the conductive layer where a left behind portion forms a pixel electrode.

18 Claims, 33 Drawing Sheets

THIN FILM TRANSISTOR ARRAY PANEL AND METHOD FOR MANUFACTURING THE SAME

CROSS-REFERENCE TO RELATED APPLICATION

This application claims priority to and the benefit of Korean Patent Application No. 10-2008-0109512 filed in the Korean Intellectual Property Office on Nov. 5, 2008, the entire contents of which application are incorporated herein by reference.

BACKGROUND (a) Field of Invention

The present disclosure of invention relates to thin film transistor array panels and manufacturing thereof.

(b) Description of Related Technology

As one of a variety of widely used flat panel displays, a conventional liquid crystal display (LCD) includes two spaced apart display panels which are respectively provided with field generating electrodes such as pixel electrodes and a common electrode. A liquid crystal material layer is interposed between the two display panels. The liquid crystal display can display images by applying voltages to the field-generating electrodes to generate an electric field in the LC layer that determines the orientation of LC molecules therein to adjust polarization of incident light.

The conventional liquid crystal display also includes color filters for color display. The color filters are typically made of an organic material including pigments. More recently, the color filters have been formed on the display panel where the array of thin film transistors are formed (on the array panel).

Meanwhile, to form the array display panel, several photolithography processes are required. Since each photolithography process typically includes several tens to several hundreds of detailed sub-processes, as the number of photolithography processes increases, the time and cost of mass production manufacturing also increase. Accordingly, methods to reduce the number of photolithography processes are desired in the industry.

The above information disclosed in this Background section is only for enhancement of understanding of the background of here disclosed invention and therefore it may contain information that does not form the prior art that is heretofore already known to persons of ordinary skill in the art.

SUMMARY

A manufacturing method of a thin film transistor array panel according to an exemplary embodiment of the present disclosure employs a selective lift-off of a conductive layer to define a pixel electrode. The selective lift-off eliminates a photolithography step and thereby simplifies the manufacturing method.

More specifically, one manufacturing method in accordance with the disclosure comprises: forming a thin film transistor on a substrate; forming a color filter on the thin film transistor; depositing a first passivation layer on the color filter; coating a photosensitive film on the first passivation layer and exposing the photosensitive film to light using a first photomask to form a first photosensitive film pattern that comprises a first portion and a second portion that is thicker than the first portion, the first photosensitive film pattern exposing the first passivation layer around a circumference of the second portion with a belt shape; removing the exposed first passivation layer using the first photosensitive film pattern as an etch mask; etching a whole surface of the first photosensitive film pattern until the first portion is removed to form a second photosensitive film pattern; depositing a conductive layer on the second photosensitive film pattern; and removing the second photosensitive film pattern to lift off the conductive layer to form a pixel electrode.

The second photosensitive film pattern may comprise a third portion where the photosensitive film remains, and in depositing of the conductive layer on the second photosensitive film pattern, at least a portion of the deposited conductive layer may be disconnected around a circumference of the third portion.

The first photomask may comprise a first transparent portion transmitting light, a first opaque portion blocking light, and a first translucent portion that corresponds to the first portion and partially transmits light.

The first translucent portion may comprise at least one of a slit pattern of a lattice shape and a translucent layer.

The formation of the thin film transistor may comprise forming a gate line on the substrate, forming a gate insulating layer on the gate line, forming a semiconductor comprising a channel on the gate insulating layer, and forming a data line comprising a source electrode and a drain electrode on the semiconductor.

The forming of the semiconductor, the data line, and the drain electrode may comprise using a second photomask.

Forming of the semiconductor, the data line and the drain electrode may comprise sequentially depositing an intrinsic semiconductor layer, an impurity-doped semiconductor layer, and a data conductive layer on the gate insulating layer, coating a photosensitive film on the data conductive layer and exposing the photosensitive film to light using the second photomask to form a third photosensitive film pattern comprising a fourth portion corresponding to the channel of the semiconductor and a fifth portion that is thicker than the fourth portion, etching the data conductive layer, the impurity-doped semiconductor layer, and the semiconductor layer by using the third photosensitive film pattern as an etch mask, etching a whole surface of the third photosensitive film pattern until the fourth portion is removed to form a fourth photosensitive film pattern, and etching the data conductive layer and the impurity-doped semiconductor layer using the fourth photosensitive film pattern.

The second photomask may comprise a second transparent portion transmitting light is transmitted, a second opaque portion blocking light is blocked, and a second translucent portion partially transmitting light.

The method may further comprise forming a second passivation layer on the thin film transistor before forming of the color filter.

The thin film transistor may comprise a gate line comprising a gate electrode and an end portion, a gate insulating layer disposed on the gate line, a semiconductor disposed on the gate insulating layer, and a data line comprising a source electrode and an end portion, and a drain electrode disposed on the semiconductor.

The color filter may comprise an opening disposed on a portion of the drain electrode, and the first photosensitive film pattern may expose the first passivation layer in the opening.

The first photosensitive film pattern may expose the first passivation layer disposed on at least a portion of the end portion of the gate line and at least a portion of the end portion of the data line, and forming of the pixel electrode may further comprise forming contact assistants respectively connected to the end portions of the data line and the gate line.

Removing of the exposed first passivation layer using the first photosensitive film pattern as the etch mask may further comprise etching the gate insulating layer using the first photo sensitive film pattern as an etch mask.

In etching of the gate insulating layer using the first photosensitive film pattern as the etch mask, the substrate around the end portion of the gate line or the end portion of the data line may be exposed.

The first portion of the first photosensitive film pattern may comprise a portion overlapping at least a portion of an edge of the end portion of the gate line or the data line, and the second portion of the first photosensitive film pattern may comprise a portion neighboring the first portion with a gap.

The method may further comprise forming a second passivation layer on the thin film transistor before forming of the color filter.

The second photosensitive film pattern may reflow by heating the second photosensitive film before removing of the second photosensitive film pattern.

The exposed portion of the first passivation layer by the first photosensitive film pattern around the circumference of the second portion may have a belt shape.

A thin film transistor array panel according to an exemplary embodiment of the present invention comprises: a substrate; a thin film transistor disposed on the substrate; a color filter disposed on the thin film transistor; a first passivation layer disposed on the color filter and comprising a first contact hole exposing a portion of the thin film transistor; and a pixel electrode disposed on the first passivation layer and connected to the thin film transistor through the first contact hole, wherein the first passivation layer comprises a cutout with a belt shape formed around a circumference of the pixel electrode.

The thin film transistor may comprise a gate line comprising a gate electrode and an end portion, a gate insulating layer disposed on the gate line, a semiconductor disposed on the gate insulating layer and comprising a channel, and a data line comprising a source electrode and an end portion, and a drain electrode disposed on the semiconductor.

A planar shape of the semiconductor except for the channel may be the same as a planar shape of the data line and the drain electrode.

The color filter may comprise an opening through which the first contact hole passes, and the pixel electrode is connected to the drain electrode through the first contact hole.

The first passivation layer may comprise a second contact hole exposing at least a portion of the end portion of the gate line, and a third contact hole exposing at least a portion of the end portion of the data line.

The thin film transistor array panel may further comprise a first contact assistant disposed in the second contact hole and connected to the end portion of the gate line, and a second contact assistant disposed in the third contact hole and connected to the end portion of the data line.

The thin film transistor array panel may further comprise a first contact assistant disposed on the first passivation layer and connected to the end portion of the gate line through the second contact hole, and a second contact assistant disposed on the first passivation layer and connected to the end portions of the data line through the third contact hole.

The first passivation layer and the gate insulating layer disposed around a circumference of the first and second contact assistants may be removed.

The thin film transistor array panel may further comprise a second passivation layer disposed between the thin film transistor and the color filter.

A portion of the color filter under the cutout may be removed.

The cutout of the first passivation layer may have a belt shape.

Figure 1:
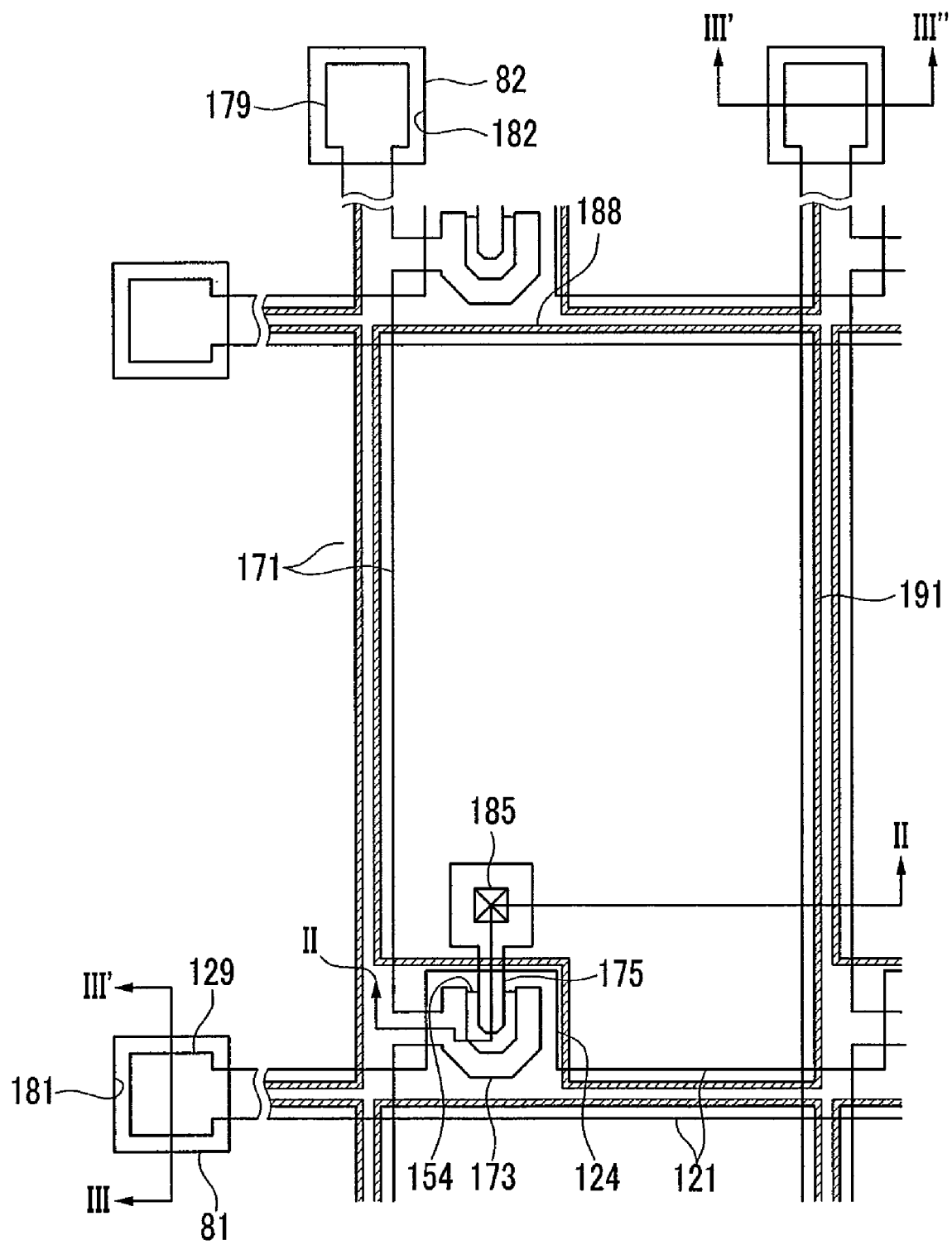
FIG. 1 is a layout view of a thin film transistor array panel according to an exemplary embodiment of the present disclosure of invention.

GLOSSARY OF REFERENCE NUMERALS INDICATING COMMON ELEMENTS IN THE DRAWINGS (FIGS. 1-47):

40, 41, 42, 43, 44, 45, 46, 51, 52, 53, 54: photosensitive film pattern
81, 82, 82a, 82b: contact assistants
110: substrate 121: gate line
124, 124a, 124b: gate electrode 140: gate insulating layer
151, 151a, 151b, 154, 154a, 154b, 159: semiconductor
161, 161a, 161b, 165, 165a, 169: ohmic contact
171, 171a, 171b: data line 173, 173a, 173b: source electrode
175, 175a, 175b: drain electrode 180, 180p, 180q: passivation layer 181, 182, 182a, 182b: contact hole
185, 185a, 185b: contact hole
188: cutout 189: furrow
191: pixel electrode
230R, 230G: color filter

DETAILED DESCRIPTION

The present disclosure of invention is provided more fully hereinafter with reference to the accompanying drawings, in which exemplary embodiments are shown. As those skilled in the art would appreciate, the described embodiments may be modified in various different ways, all without departing from the spirit or scope of the present disclosure.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a thin film transistor array panel according to a first exemplary embodiment will be described in detail with reference to FIG. 1 to FIG. 3.

Figure 2:
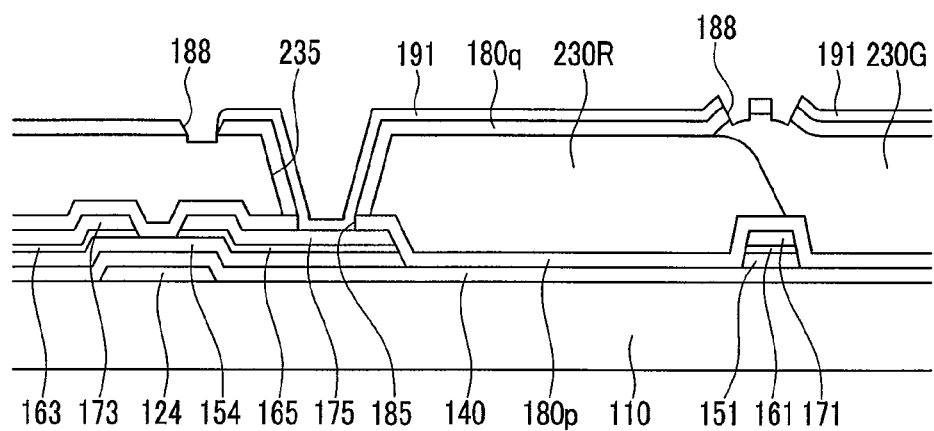
FIG. 2 and FIG. 3 are cross-sectional views of the thin film transistor array panel shown in FIG. 1 taken along the lines II-II' and III-III'-III"
Figure 3:
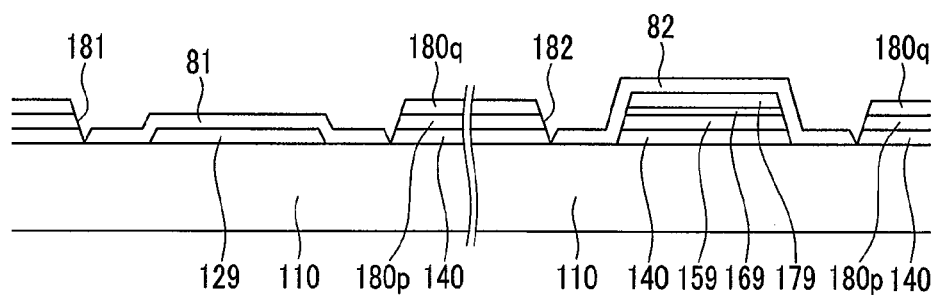

FIG. 1 is a layout view of a thin film transistor array panel according to a first exemplary embodiment, and FIG. 2 and FIG. 3 are cross-sectional views of the thin film transistor array panel shown in FIG. 1 respectively taken along the lines II-II and III-III'-III".

In the embodiment, a plurality of gate lines 121 are integrally formed on a light passing and electrically insulating substrate 110 where the latter may be made of a material such as transparent glass or plastic. Each gate line 121 transmits gate signals and extends in the row direction (horizontally across FIG. 1), and each has a plurality of gate electrodes 124 integrally extending upward therefrom. Each gate line 121 also has an end portion 129 (line terminus) for connection with another layer or with a gate driver circuit (not shown).

A gate insulating layer 140 such as one made of a silicon nitride (SiNx) or a silicon oxide (SiOx) is formed on the gate line 121.

A plurality of semiconductive layer patterns or stripes 151 that may be made of hydrogenated amorphous silicon (simply referred to as a-Si) or of a crystallized silicon are formed on the gate insulating layer 140. The semiconductive stripes 151 substantially extend in the lateral direction in FIGS. 2-3, and include a plurality of protrusions such as 154 extending therefrom toward and over the gate electrodes 124. The semiconductive stripes 151 also include an end portion 159 having a wide area.

A plurality of ohmic contact stripes 161 and a plurality of ohmic contact islands 165 are formed on the semiconductor stripes 151. The ohmic contact stripes 161 include a plurality of protrusions 163 extending over and along the protrusions 154 of the semiconductive layer, and an end portion 169 having a wide area. The protrusions 163 and the ohmic contact islands 165 are spaced apart opposite to each other and spaced apart with respect to the gate electrode 124, thus forming a source/drain contact pair. As seen in FIG. 2, the ohmic contacts, 163 and 165 are disposed on the protrusions 154 of the semiconductive stripes 151. The ohmic contacts 161, 163 and 165 may be made of a material such as n+ doped hydrogenated amorphous silicon in which an n-type impurity such as phosphorus is provided with a relatively high concentration, or of silicide.

A plurality of data lines 171 and a plurality of drain electrodes 175 are respectively formed on the ohmic contacts 161 and 165.

The data lines 171 transmit data voltages and extend in a longitudinal direction, thereby crossing with the horizontal gate lines 121. Each of the data lines 171 includes a plurality of source electrodes 173 extending toward the gate electrodes 124 and being curved with a "U" shape, and an end portion 179 for connection with another layer or a data driver circuit (not shown).

The drain electrodes 175 include an end portion having a bar shape facing the source electrodes 173 and another end having a quadrangle shape having a wide area.

A plurality of gate lines 121 extending in the row direction and a plurality of data lines 171 extending in the column direction may define respective pixel areas arranged in a matrix.

A gate electrode 124, a source electrode 173, and a drain electrode 175 form a thin film transistor (TFT) along with a protrusion 154 of the semiconductor stripe 151, and the channel region of the thin film transistor is formed in the semiconductive protrusion 154 between the source electrode 173 and the drain electrode 175.

The protrusions 154 of the semiconductor stripes 151 include exposed portions that are not covered by the ohmic contact layers 161 and 165, and the data lines 171 and the drain electrodes 175 such as the portion between the source electrodes 173 and the drain electrodes 175. That is, the semiconductor stripes 151 except for the channel between the source electrode 173 and the drain electrode 175 have the same planar shape as that of the data lines 171, the drain electrodes 175, and the underlying ohmic contacts 161 and 165. Also, the ohmic contacts 161 and 165 have substantially the same planar shape as that of their respective data lines 171 and the drain electrodes 175.

A light-passing lower passivation layer 180p is formed on the gate insulating layer 140, the data line 171, the drain electrode 175, and the exposed protrusions 154 of the semiconductor stripes 151. The lower passivation layer 180p may be made of an inorganic insulator such as a silicon nitride or a silicon oxide.

Color filters 230R (red) and 230G (green) are formed on the lower passivation layer 180p as seen in FIG. 2. The color filters 230R and 230G may extend parallel to the data lines 171 along the regions defined by the data lines 171 or the column of the pixels PX. Two neighboring color filters 230R and 230G may represent different primary colors, and the primary colors of the display may include red, green, and blue. Two neighboring color filters 230R and 230G may overlap each other near the data lines 171. Overlapping the edges of the color filters 230R and 230G may act substantially as full light absorbers and thus prevent leakage of light between the pixels PX. In other words, they substitute for the conventional black matrix of some LCD designs. The color filters 230R and 230G may be made of a photosensitive organic material (e.g., Novolac) including color pigments. The lower passivation layer 180p can function to prevent the pigments of the color filters 230R and 230G from flowing (leaching) into the exposed protrusions 154 of the semiconductor stripes 151.

The color filters 230R and 230G have a plurality of openings such as drain contact holes 235 over at least a portion of the drain electrodes 175. The color filters 230R and 230G are not present in a peripheral area of the display panel where the respective end portions 129 and 179 of the gate lines 121 and the data lines 171 are formed.

A light-passing upper passivation layer 180q is formed over the color filters 230R and 230G. The upper passivation layer 180q has a plurality of cutouts 188 formed around a peripheral circumference of each of the pixels PX. The upper surface of the color filters 230R and 230G disposed under the cutouts 188 may be thinly removed along the cutouts 188. The upper passivation layer 180q may be made of an inorganic insulator such as a silicon nitride or a silicon oxide, and prevents the color filters 230R and 230G from being undesirably lifted off and prevents a chemical solution such an etchant from flowing into the color filters 230R and 230G.

The lower passivation layer 180p and the upper passivation layer 180q have a plurality of contact holes 185, 182 respectively exposing the drain electrodes 175 (seen in FIG. 2), and the gate insulating layer 140 (seen in FIG. 3). The lower passivation layer 180p, and the upper passivation layer 180q further have a plurality of contact holes 181 and 182 as seen in FIG. 1 that respectively expose the end portions 129 and 179 of the gate lines 121 and the data lines 171. The drain contact holes 185 are smaller than the openings 235 of the color filters 230R and 230G, and they pass through the openings 235. The contact holes 181 and 182 may expose the substrate 110 around the end portions 129 and 179 of the gate lines 121 and the data lines 171.

A plurality of pixel electrodes 191 are respectively formed on the upper passivation layer 180q and extending down into contact with the exposed drain electrodes 175. At the same time, a plurality of contact assistants 81 and 82 are respectively formed on the end portions 129 and 179 of the gate lines 121 and the data lines 171 in the contact holes 181 and 182 and on the insulating substrate 110 around the end portions 129 and 179. These electrodes may be made of a light-passing conductive material such as indium tin oxide (ITO) or indium zinc oxide (IZO), or in places where light may be blocked or reflected; of a reflective metal such as aluminum, silver, chromium, or alloys thereof.

The pixel electrodes 191 have a quadrangular shape in which the four main sides thereof extend substantially parallel to the gate lines 121 and the data lines 171. Corner areas of the pixel electrodes 191 where the thin film transistor is disposed may be removed or omitted. Most of each pixel electrode 191 is disposed on the upper passivation layer 180q. The pixel electrodes 191 are physically and electrically connected to the drain electrodes 175 through the contact holes 185, and receive data voltages from the drain electrodes 175.

The contact assistants 81 and 82 cover the end portions 129 and 179 of the gate lines 121 and the data lines 171 in the contact holes 181 and 182, thereby being connected thereto. The contact assistants 81 and 82 supplement adhesion of the end portions 129 of the gate lines 121 and the end portions 179 of the data lines 171 to external devices such as driving integrated circuits and protect the end portions 129 of the gate lines 121 and the end portions 179 of the data lines 171. The planar shape of the contact assistants 81 and 82 may be substantially the same as that of the contact holes 181 and 182.

Next, a manufacturing method of a thin film transistor array panel according to an exemplary embodiment will be described with reference to FIG. 4 to FIG. 32 as well as FIG. 1 to FIG. 3.

Figure 4:
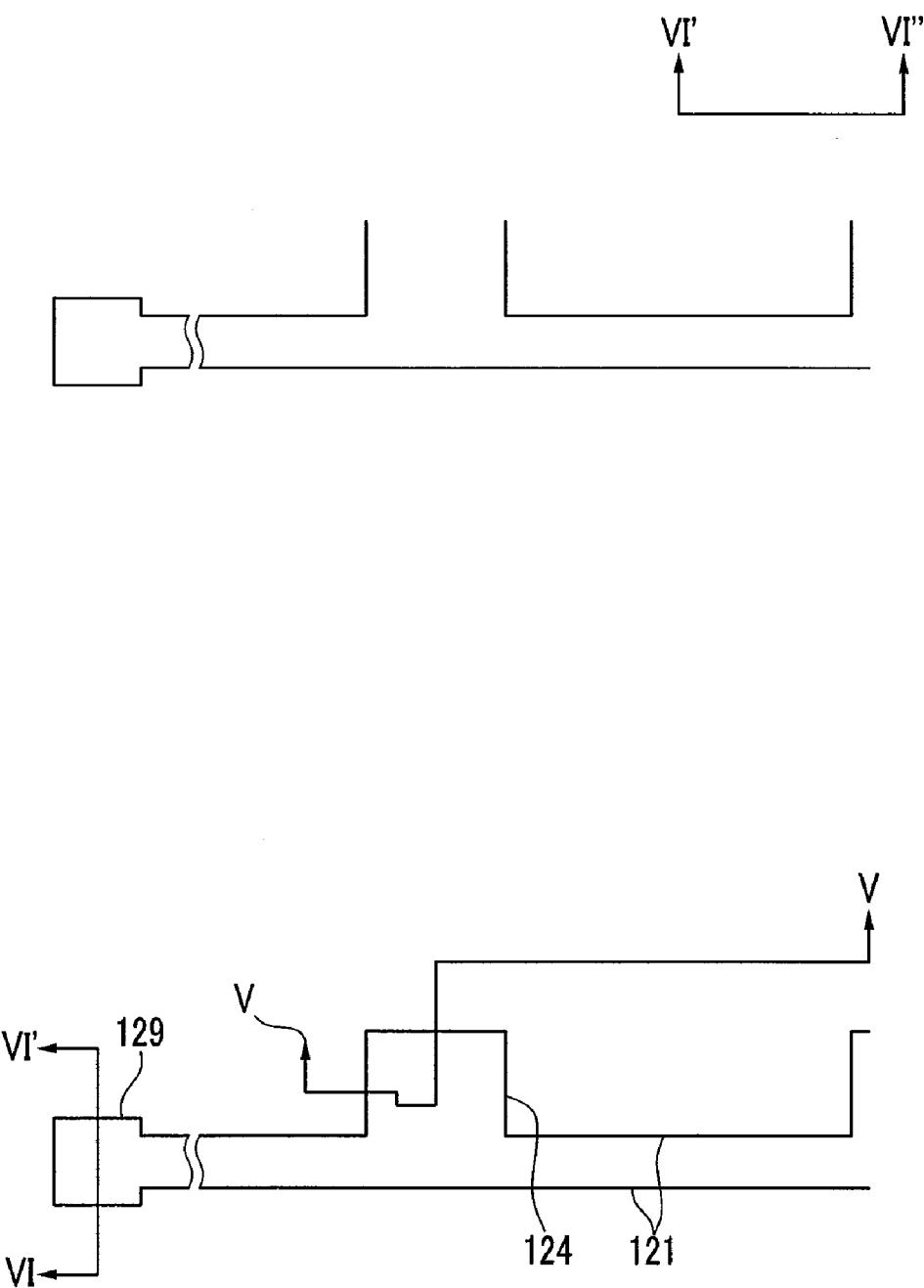
FIG. 4, FIG. 11, and FIG. 16 are layout views showing intermediate steps of a manufacturing process of the thin film transistor array panel shown in FIG. 1 according to an exemplary embodiment.
Figure 10:
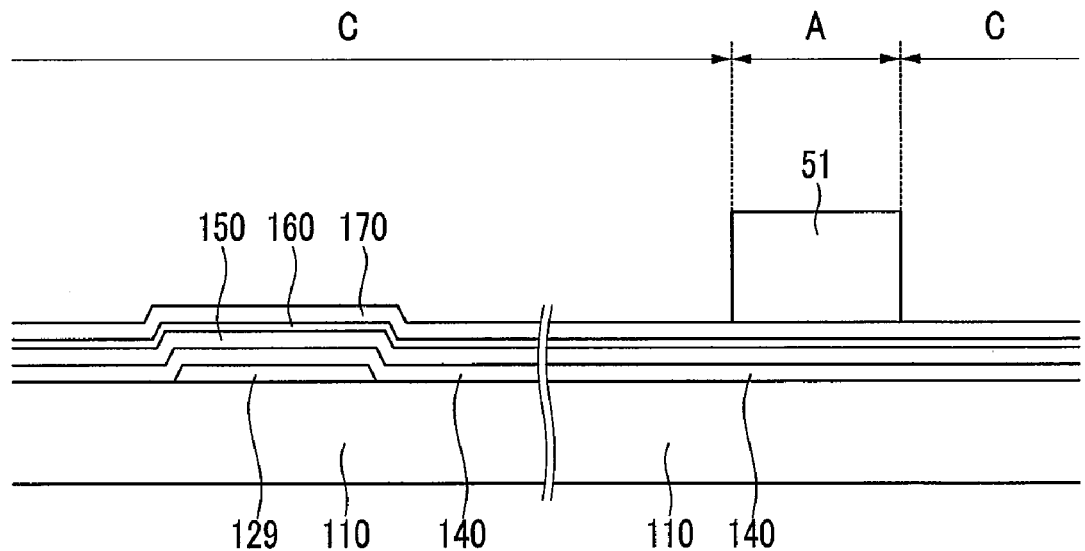
Figure 11:
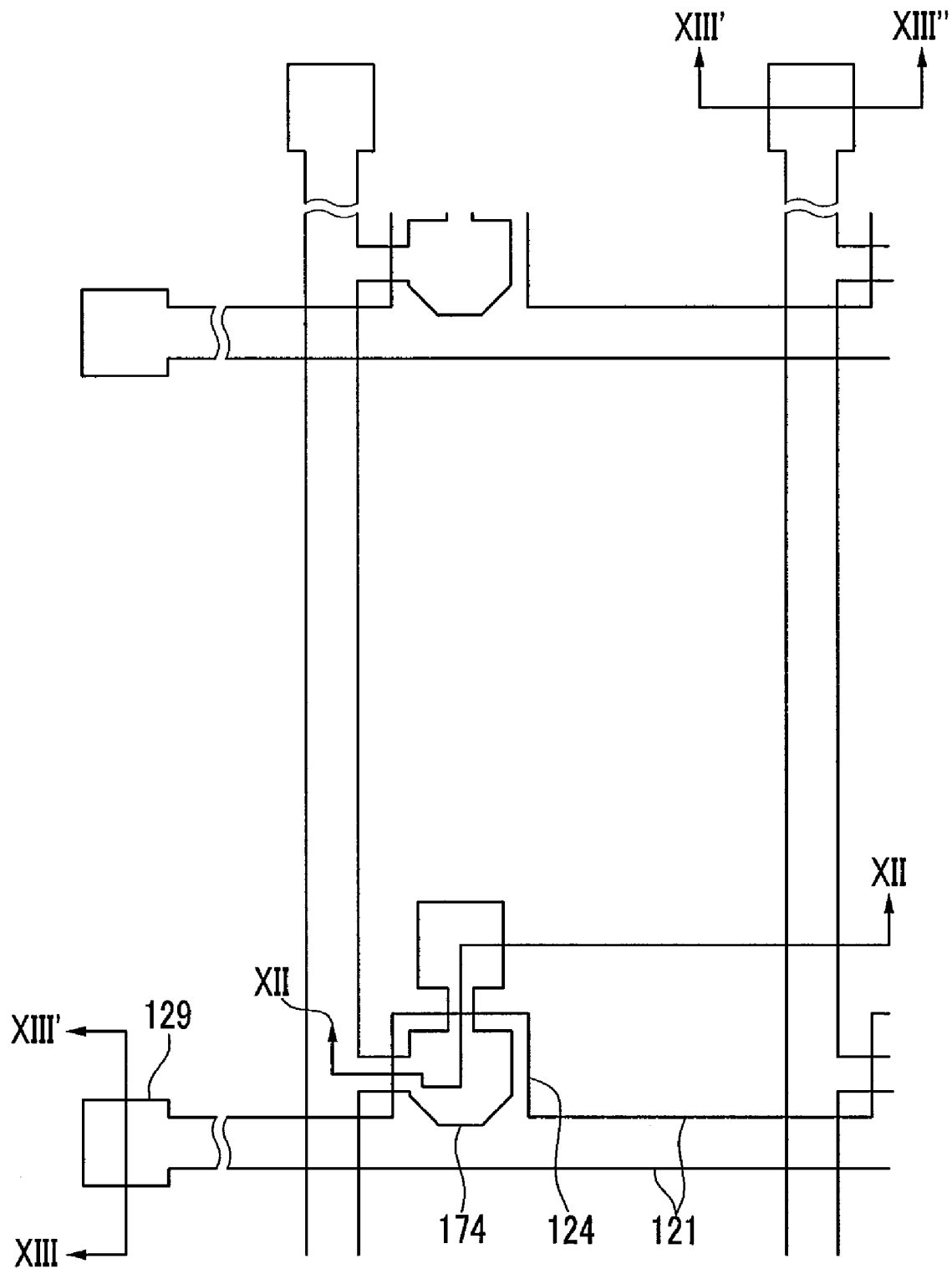
Figure 15:
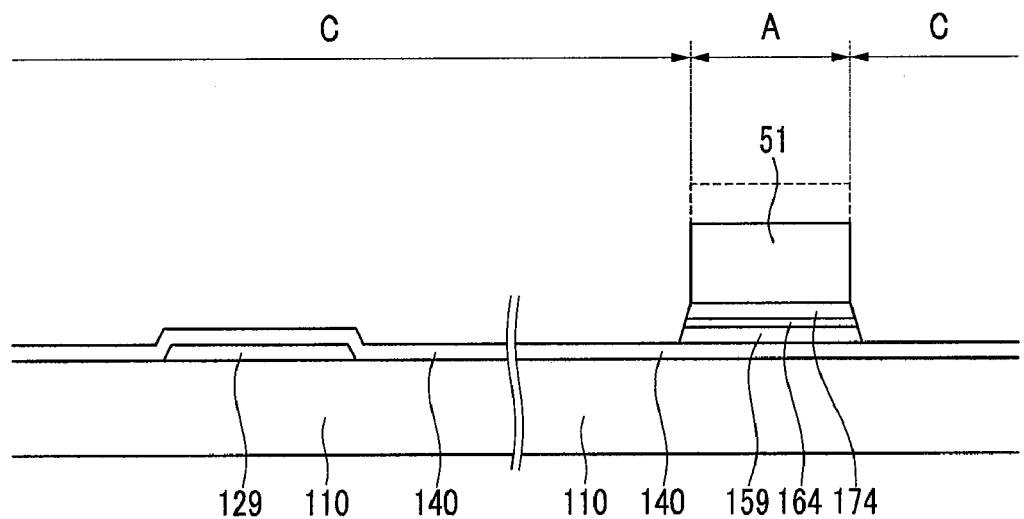
Figure 16:
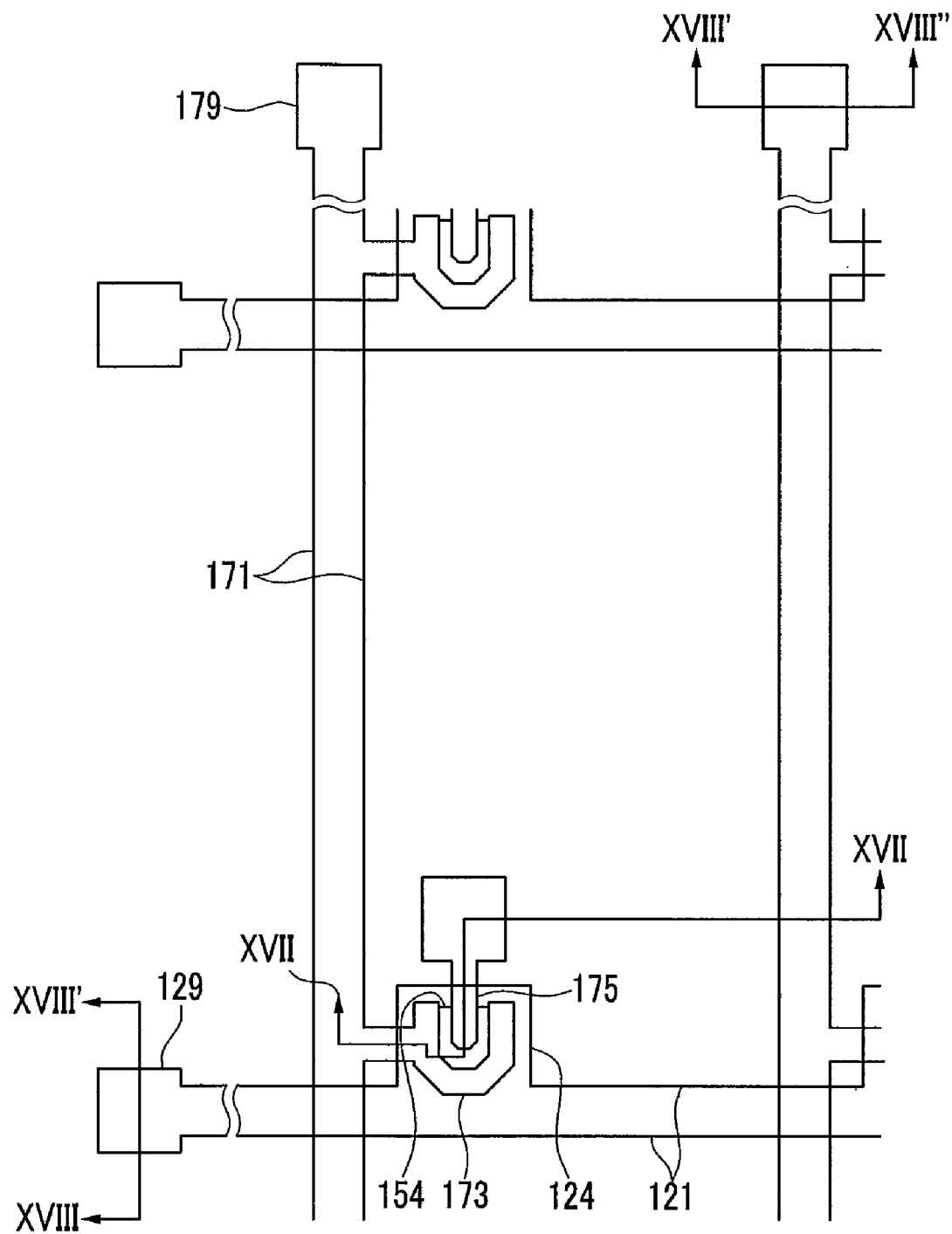

FIG. 4, FIG. 11, and FIG. 16 are layout views showing intermediate steps of a manufacturing process of the thin film transistor array panel shown in FIG. 1 according to an exemplary embodiment of the present invention, and FIG. 5 to FIG. 10, FIG. 12 to FIG. 15, and FIG. 17 to FIG. 32 are cross-sectional views showing intermediate steps of a manufacturing process of the thin film transistor array panel shown in FIG. 1 according to an exemplary embodiment.

Figure 5:
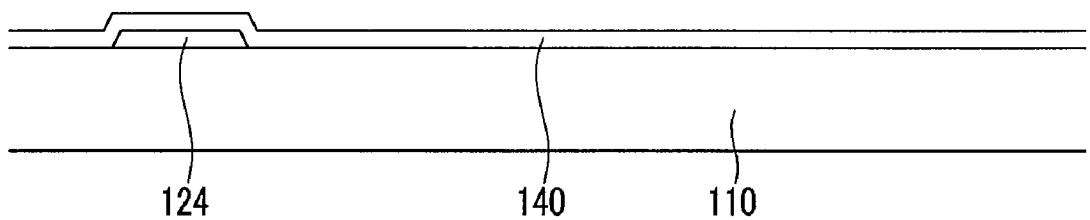
FIG. 5 to FIG. 10 are cross-sectional views showing intermediate steps of a manufacturing process of the thin film transistor array panel shown in FIG. 1 according to an exemplary embodiment, these showing the thin film transistor array panel shown in FIG. 4 taken along the lines V-V and VI-VI'.
Figure 6:
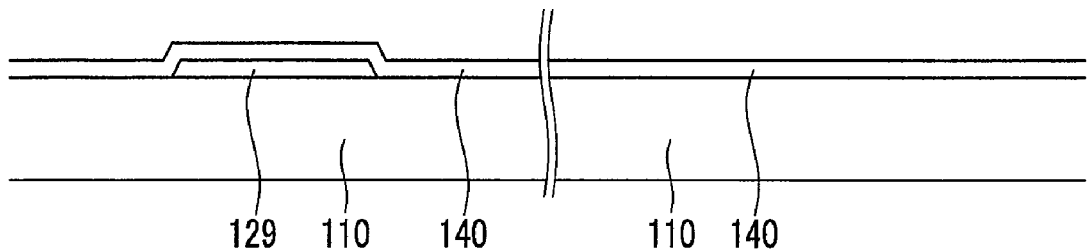

Referring to FIG. 4 to FIG. 6, a metal having low resistance such as an aluminum-based metal, a silver-based metal, and a copper-based metal is deposited by sputtering on an insulating substrate 110 that is made of a material such as transparent glass or plastic, and is patterned by photolithography to form a plurality of gate lines 121 that include gate electrodes 124 and an end portion 129.

Next, a gate insulating layer 140 of silicon nitride or silicon oxide is deposited on the gate lines 121.

Figure 7:
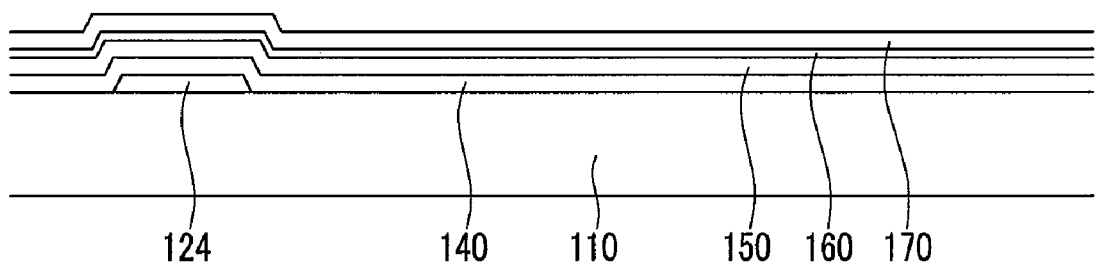
Figure 8:
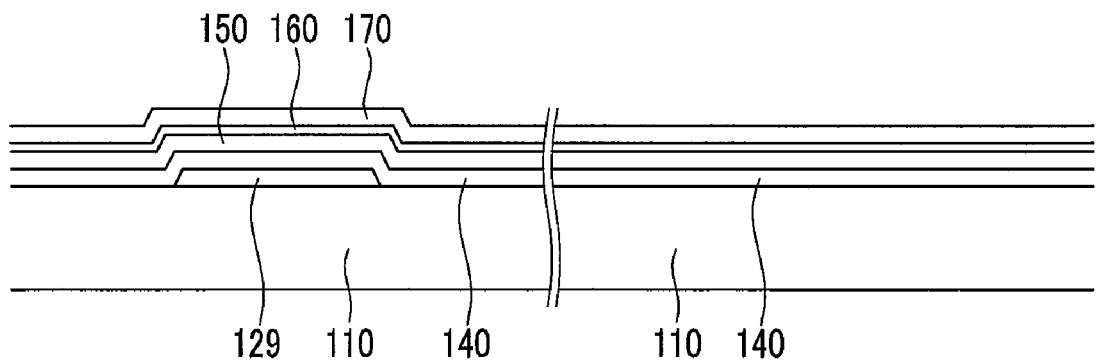

Next, referring to FIG. 7 and FIG. 8, an intrinsic semiconductor layer 150 of amorphous silicon or crystallized silicon, a semiconductor layer 160 doped with an impurity, and a data-line forming conductive layer 170 are sequentially deposited on the gate insulating layer 140.

Figure 9:
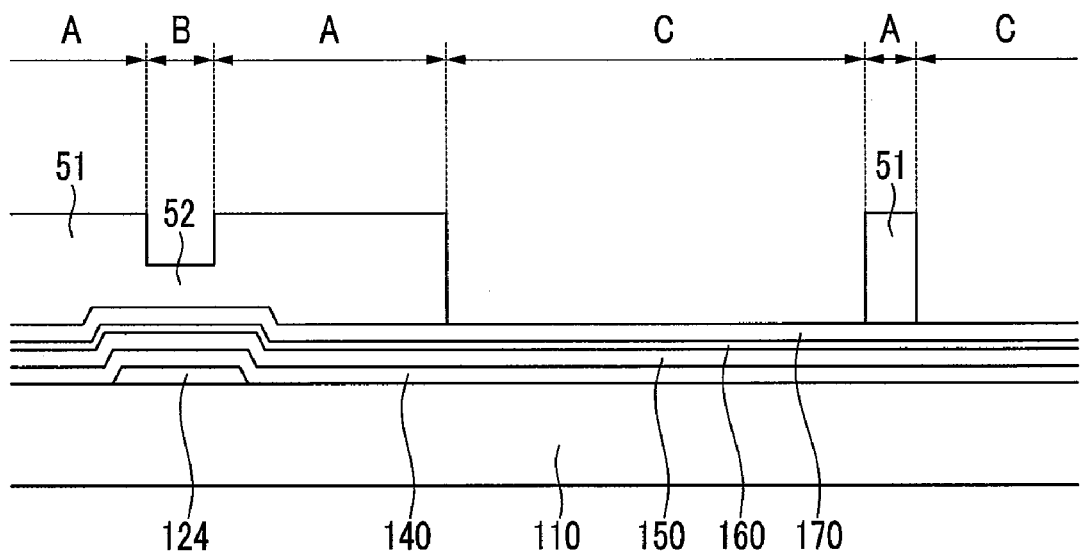

Next, referring to FIG. 9 and FIG. 10, a photosensitive film (not shown) is coated on the data-line forming conductive layer 170 and is exposed to light and developed using a photomask (not shown) to form a photosensitive film pattern including a thick portion 51 and a thinner portion 52 as shown.

Here, when the photosensitive film (not shown) has negative photosensitivity where a portion exposed to light remains, the portion of the photomask (not shown) in the A region of is transparent so that light is transmitted, the portion of the photomask (not shown) in the C region is opaque so that light is blocked, and the portion of the photomask (not shown) in the B region is translucent so that development light is partially transmitted therethrough. The photosensitive film corresponding to the A region where light is transmitted becomes the thick portion 51, the photosensitive film corresponding to the C region is completely removed, and the photosensitive film corresponding to the B region becomes the thin portion 52. Alternatively, when using a photosensitive film (not shown) with positive photosensitivity where a portion exposed to light is removed, the transmittances of the photomask (not shown) in the A and C regions are reversed, and the portion of the photomask in the B region is still translucent.

The photomask (not shown) disposed in the B region may include slits or a lattice pattern to control transmittance of light, or may be a translucent layer. The width of the slits and the interval between the lattice patterns may be less than a resolution of a light exposer used in the exposing process, and when using a translucent layer, thin films having a middle transmittance or a middle thickness may be used.

Figure 12:
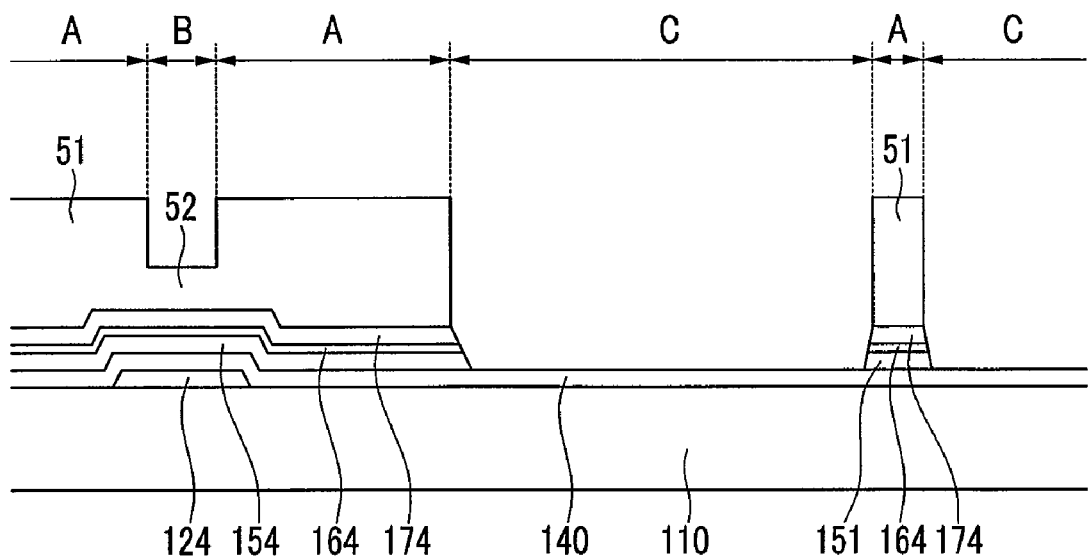
FIG. 12 to FIG. 15 are cross-sectional views showing intermediate steps of a mass production manufacturing process of the thin film transistor array panel shown in FIG. 1 according to an exemplary embodiment, these showing the thin film transistor array panel shown in FIG. 11 taken along the lines XII-XII and XIII-XIII'-XIII"
Figure 13:
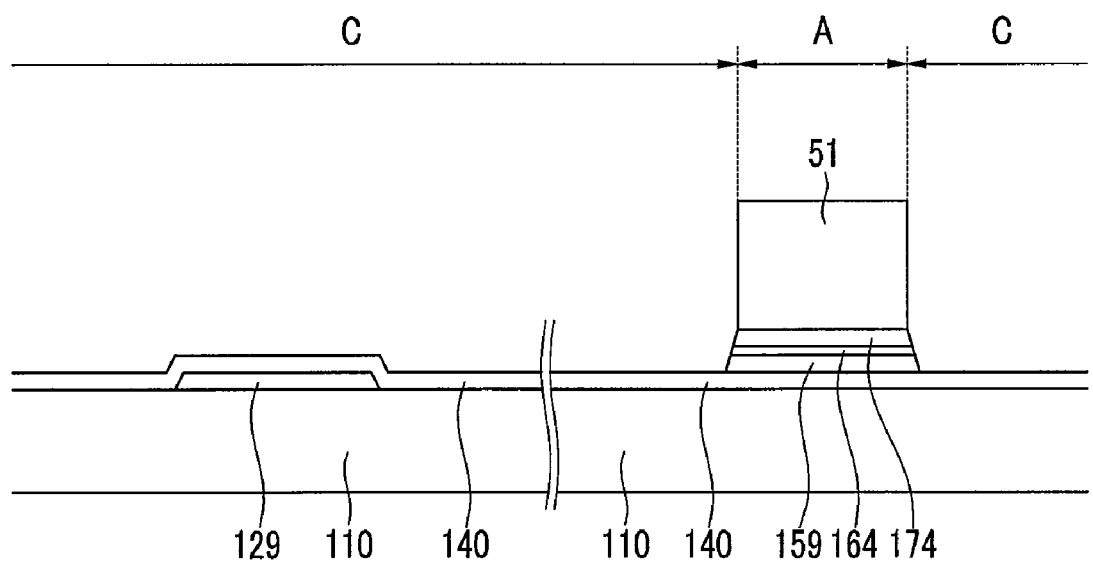

Next, referring to FIG. 11 to FIG. 13, the data conductive layer 170, the impurity-doped semiconductor layer 160, and the intrinsic semiconductor layer 150 that are disposed in the C region are removed by use of appropriate wet or dry etching using the photosensitive film pattern including the thick portion 51 and the thin portion 52 as an etching mask. Then, a plurality of data conductor defining layers 174, a plurality of ohmic contact layers 164, and a plurality of semiconductor stripes 151 each including protrusions 154 and an end portion 159 that have the same planar shapes are formed as shown.

Figure 14:
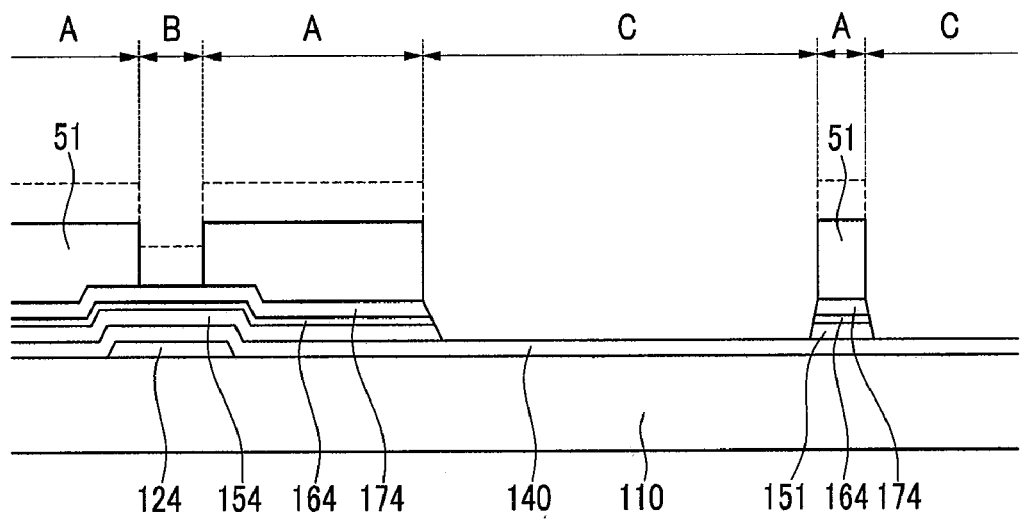

Next, referring to FIG. 14 and FIG. 15, a whole surface of the photosensitive film pattern including the thick portion 51 and the thin portion 52 is blanket etched only partially down by for example an ashing process using oxygen plasma to thereby reduce the thickness thereof until the thin portion 52 of the photosensitive film pattern disposed in the B region is fully removed to create an exposure hole to layer 174. Here, the thickness of the thick portion 51 is reduced as much as the removed thickness of the thin portion 52.

Figure 17:
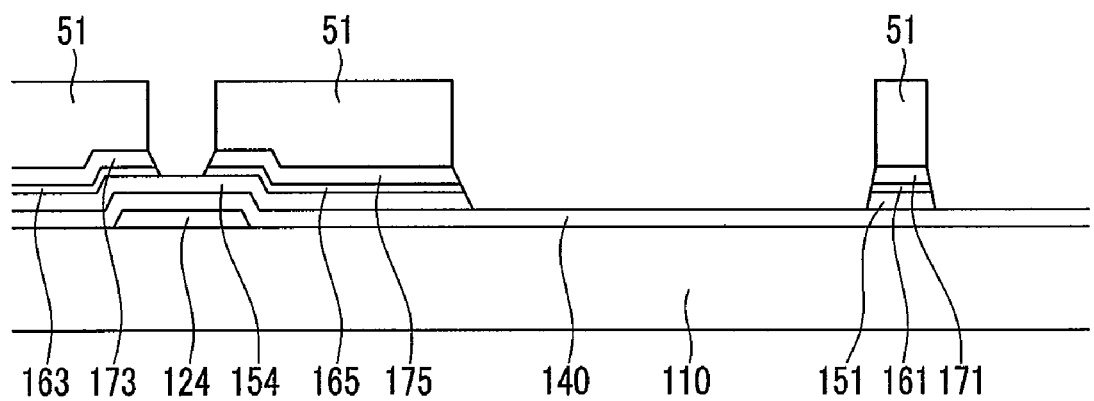
FIG. 17 to FIG. 32 are cross-sectional views showing intermediate steps of a manufacturing process of the thin film transistor array panel shown in FIG. 1 according to an exemplary embodiment, these showing the thin film transistor array panel shown in FIG. 16 taken along the lines XVII-XVII and XVIII-XVIII'-XVIII"
Figure 18:
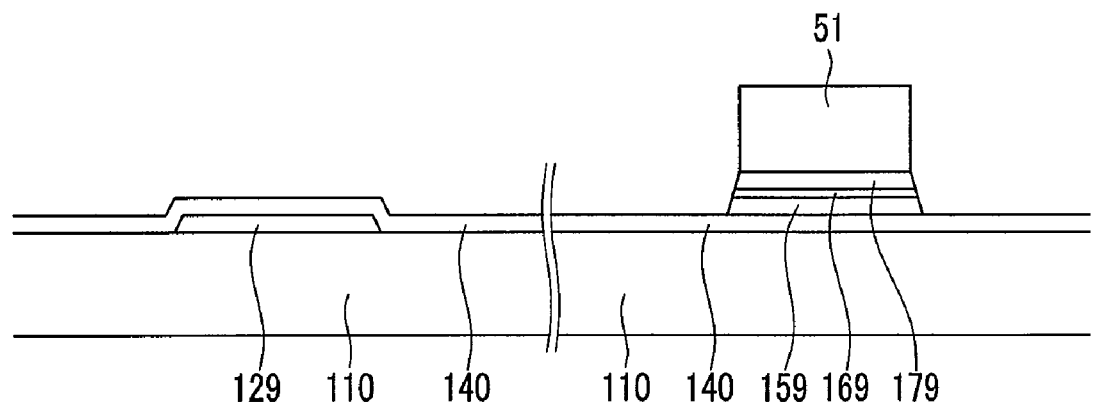

Next, as shown in FIG. 16 to FIG. 18, the data-line defining conductor layer 174 and the ohmic contact layer 164 are etched using the remaining photosensitive film pattern as an etch mask to form a corresponding plurality of data lines 171 including source electrodes 173 and end portions 179, and also a plurality of drain electrodes 175, a plurality of ohmic contact stripes 161 including protrusions 163 and end portions 169, and a plurality of ohmic contact islands 165. Here, the data-lines defining conductor layer 174 may be wet-etched, and the ohmic contact layer 164 may be dry-etched.

Figure 19:
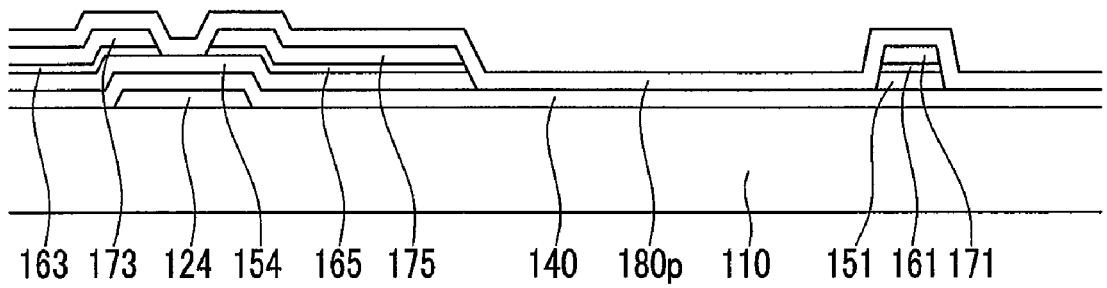
Figure 20:
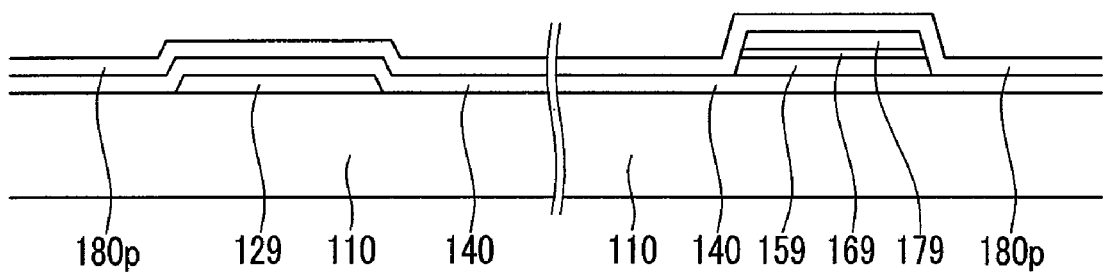

Next, referring to FIG. 19 and FIG. 20, the remaining photosensitive film pattern is removed, and a silicon nitride and/or a silicon oxide is/are deposited using chemical vapor deposition (CVD) method to thereby form the lower passivation layer 180p.

Figure 21:
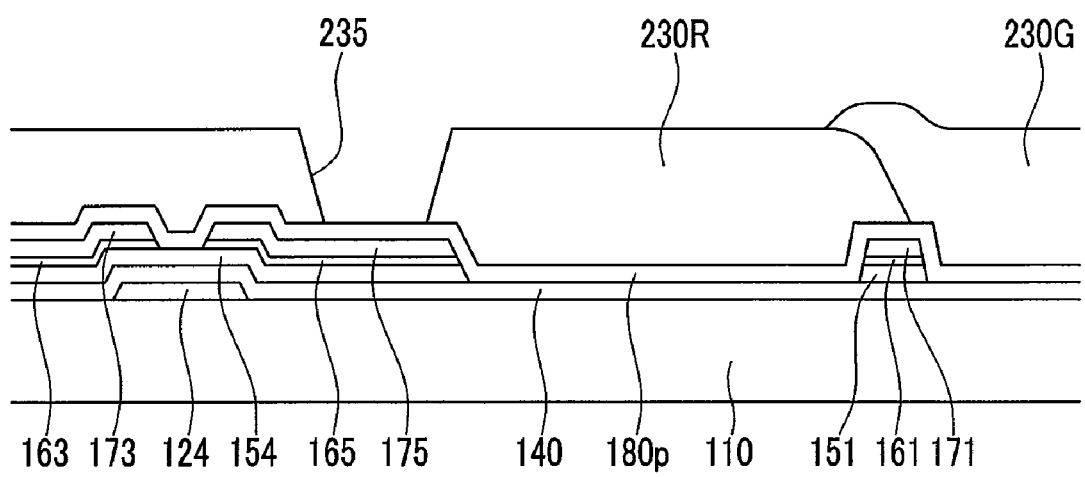
Figure 22:
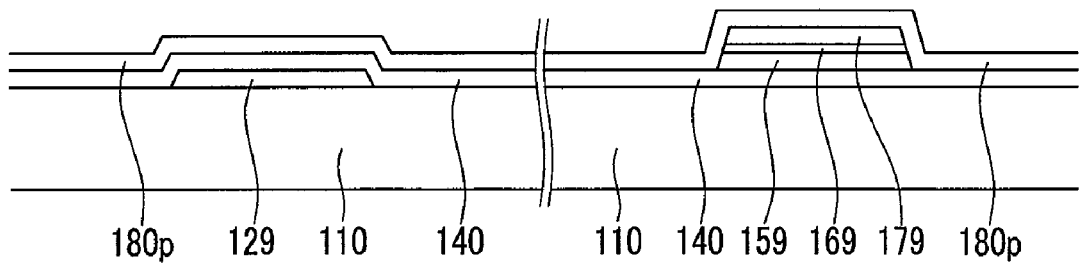

Next, referring to FIG. 21 and FIG. 22, color filters 230R and 230G are formed on the lower passivation layer 180p and one overlapping the other as shown. The color filters 230R and 230G may be formed by a solution process such as spin coating or Inkjet printing, or by deposition using a shadow mask. The color filters 230R and 230G may be respectively formed in the respective pixel areas PX assigned for each primary color, or may be formed in a stripe shape along columns of pixels PX. In the illustrated example, the color filter 230R was deposited and haredened first and then 230G was deposited so as to partially overlap on top of the color filter 230R in the to-be-blacked out region of data line 171. Over the area of the TFT, the drain-contacting openings 235 are formed in a portion of the color filters 230R and 230G corresponding to portions of the drain electrodes 175. The color filters 230R and 230G are not present in a peripheral area of the panel where instead the end portions 129 and 179 of the gate lines 121 and the data lines 171 are formed.

Figure 23:
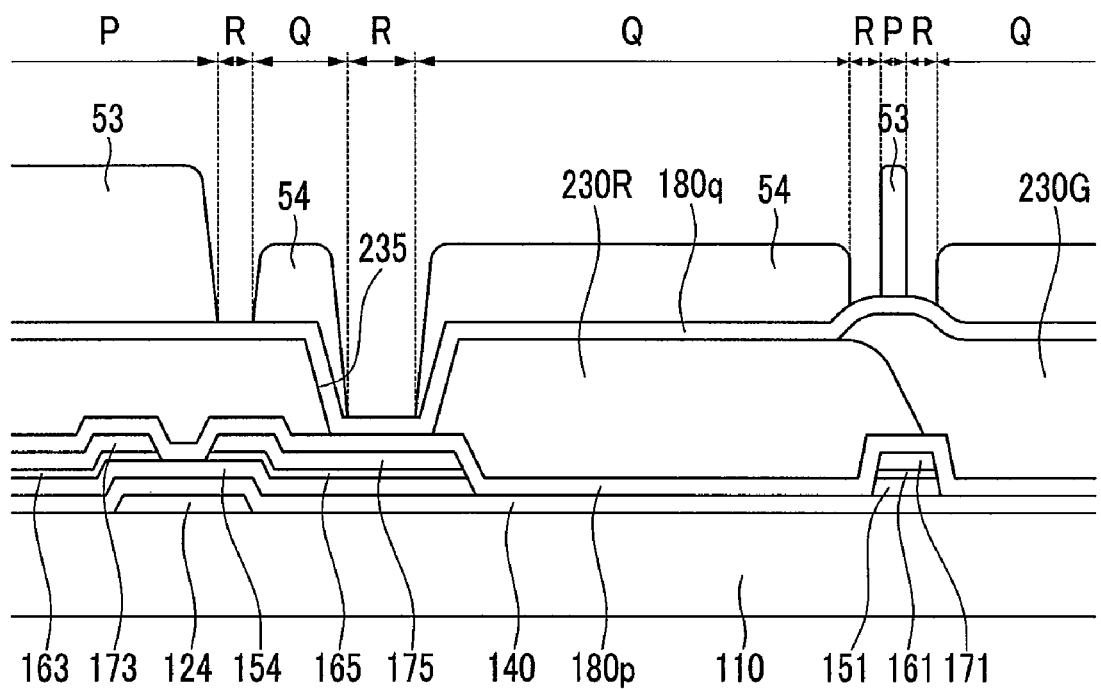
Figure 24:
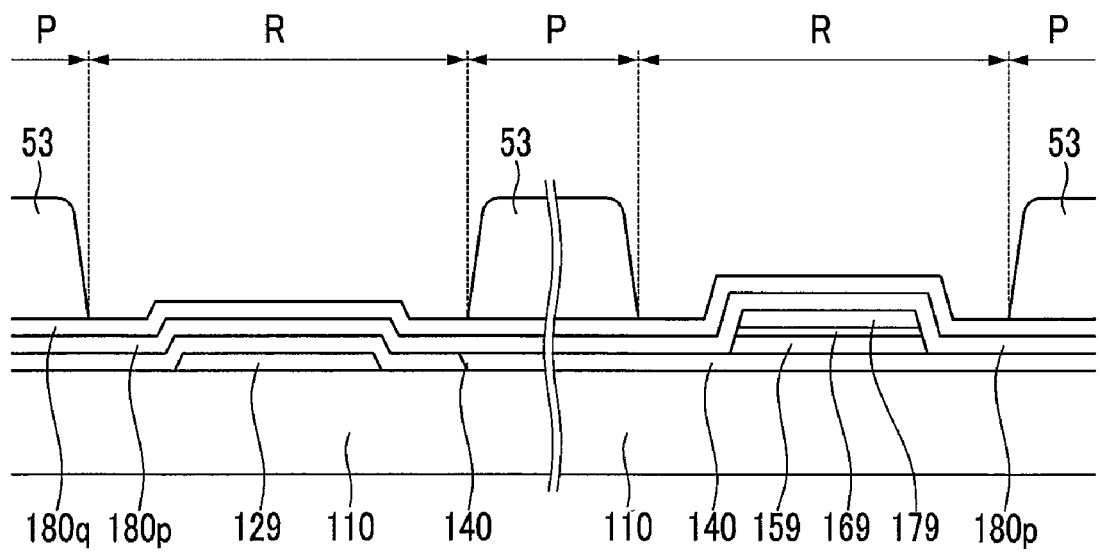

Next, referring to FIG. 23 and FIG. 24, an upper passivation layer 180q composed of a silicon nitride and/or a silicon oxide is formed by low temperature chemical vapor deposition (LTCVD) on the color filters 230R and 230G.

Next, still referring to FIG. 23 and FIG. 24, a photosensitive film (not shown) is coated on the upper passivation layer 180q, and is exposed to light and developed using a photomask (not shown) to form a photosensitive film pattern including a thick portion 53 and a thinner portion 54 in the areas (P, R, Q) shown. The photosensitive film pattern including the thick portion 53 and the thin portion 54 includes several portions where the photosensitive film does not exist such as to the portions between neighboring thick portion 53 and thin portion 54.

Here, when the photosensitive film (not shown) has negative photosensitivity where the portion exposed to light remains, the portion of the photomask in the P region (not shown) is transparent such that light is transmitted, the portion of the photomask (not shown) in the R region is opaque such that light is blocked, and the portion of the photomask (not shown) in the Q region is translucent such that light is partially transmitted. The photosensitive film corresponding to the P region where light is transmitted becomes the thick portion 53, the photosensitive film corresponding to the R region is completely removed, and the photosensitive film corresponding to the Q region becomes the thin portion 54. Alternatively, when using a photosensitive film (not shown) with positive photosensitivity where a portion exposed to light is removed, the transmittances of the photomask (not shown) in the P and R regions are reversed and the portion of the photomask in the Q region is still translucent.

Figure 25:
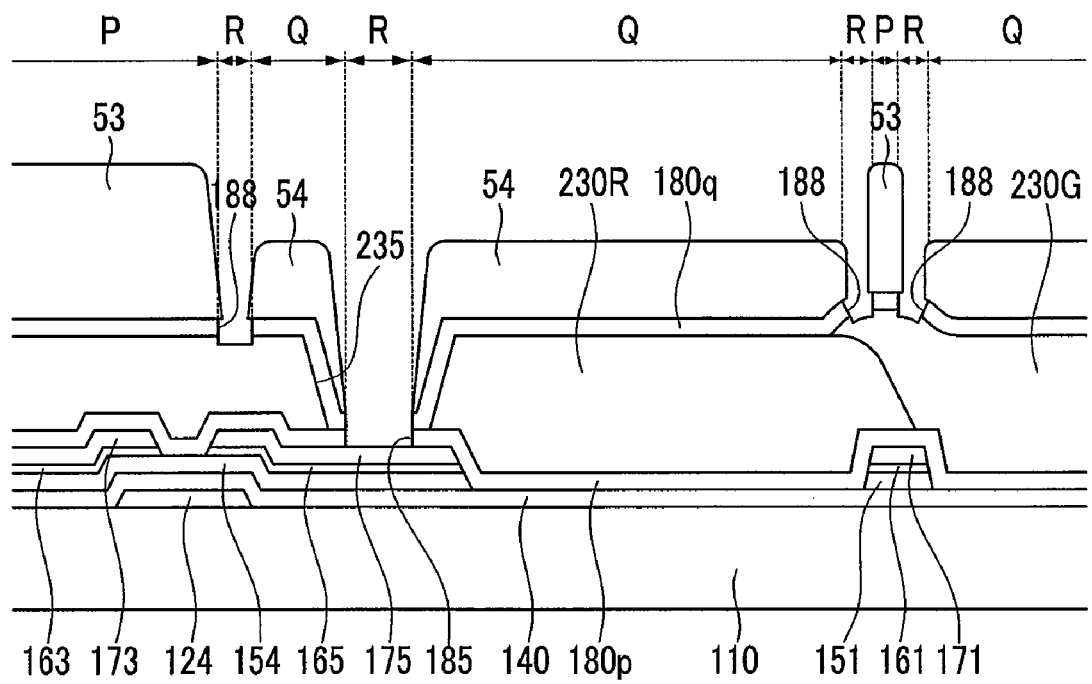
Figure 26:
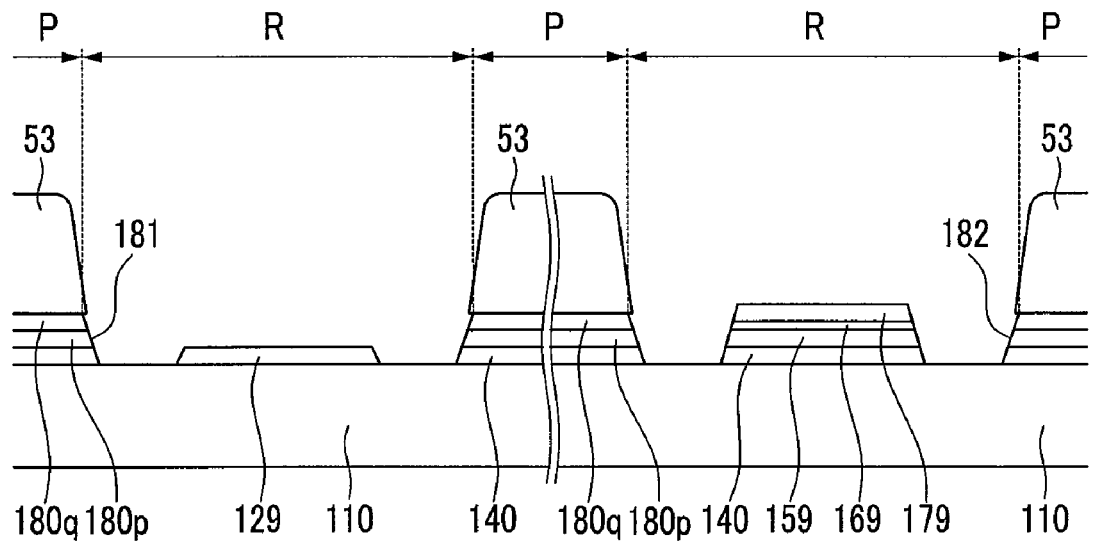

Next, referring to FIG. 25 and FIG. 26, the upper passivation layer 180q, the lower passivation layer 180p, and the gate insulating layer 140 disposed in the R region are removed through dry etching using the photosensitive film pattern including the thick portion 53 and the thinner portion 54 as an etch mask. Accordingly, cutouts 188 through the upper passivation layer 180q are formed and contact holes 185 exposing a portion of the drain electrodes 175 are formed, and contact holes 181 and 182 exposing the end portions 129 and 179 of the gate lines 121 and the data lines 171 and the substrate 110 around are formed near the end portions 129 and 179 of the gate lines 121 and the data lines 171. The upper passivation layer 180q, the lower passivation layer 180p, and the gate insulating layer 140 may be overetched, thereby forming an undercut under the photosensitive film pattern including the thick portion 53 and the thin portion 54. The color filters 230R and 230G exposed by the cutouts 188 of the upper passivation layer 180q may be slightly removed as a result.

Figure 27:
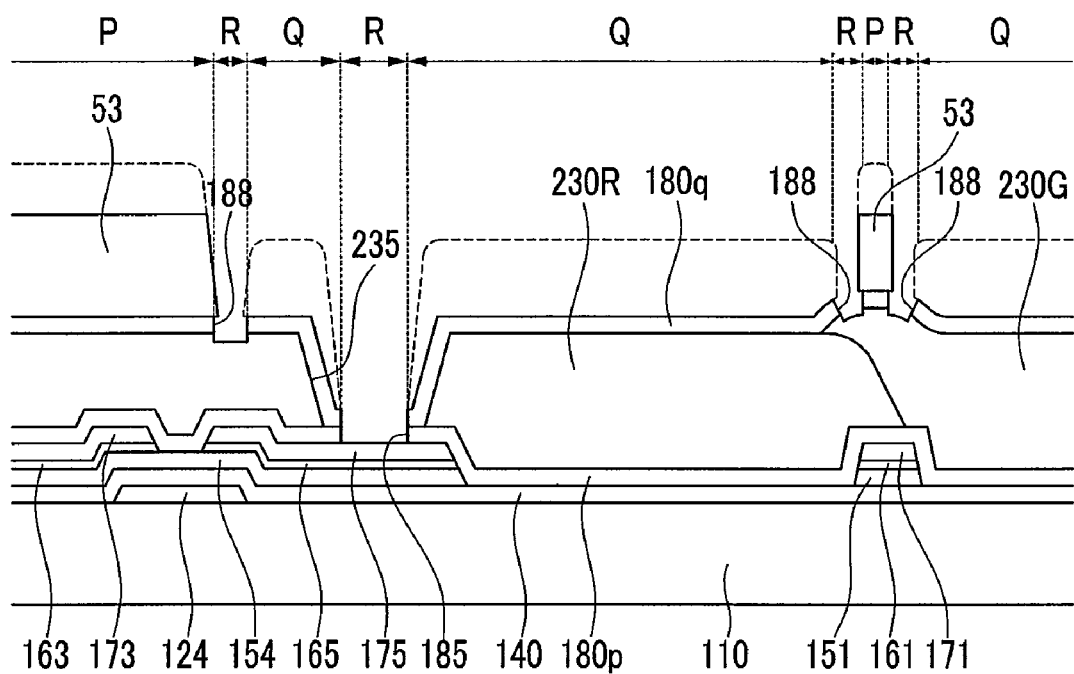
Figure 28:
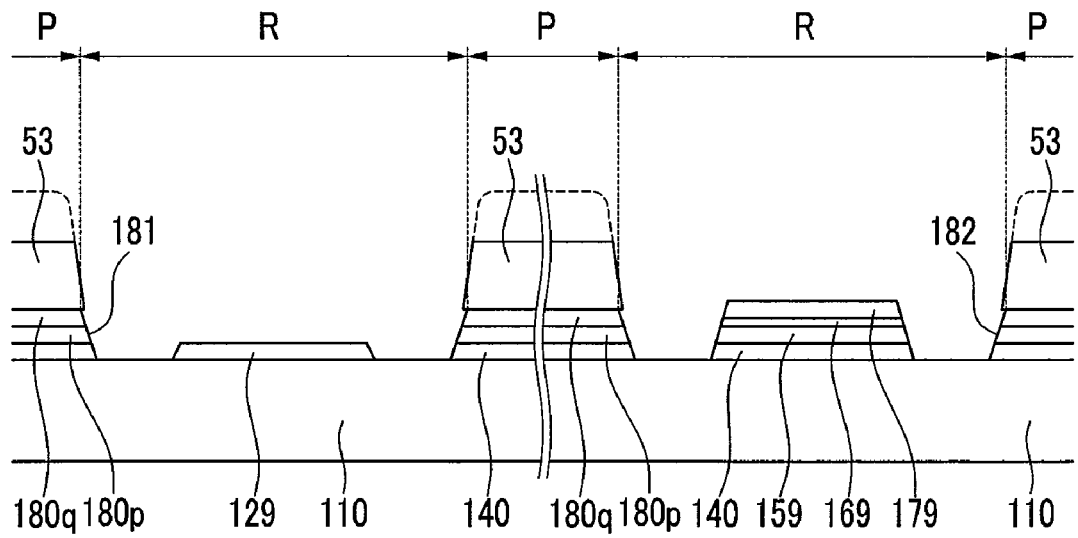

Next, referring to FIG. 27 and FIG. 28, a whole surface of the photosensitive film pattern including the thick portion 53 and the thin portion 54 is blanket etched to partially reduce the thickness thereof until the thinner portion 54 of the photosensitive film pattern disposed in the region Q is removed. Here, the thickness of the thick portion 53 may be reduced as much as the thickness of the removed thinner portion 54.

Figure 29:
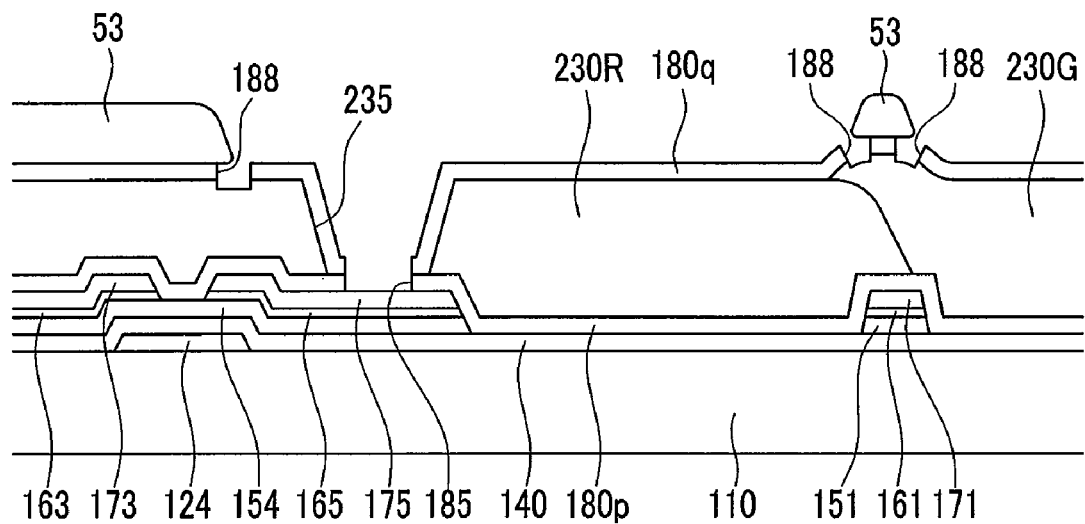
Figure 30:
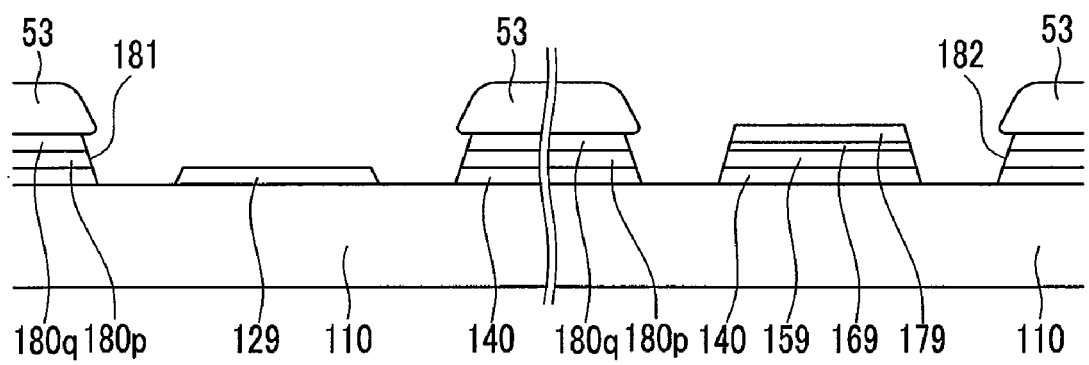

Next, referring to FIG. 29 and FIG. 30, the remaining photosensitive film pattern is subjected to heat treatment or baking so that the photosensitive film pattern reflows. Accordingly, the remaining photosensitive film pattern flows beyond the boundary of the upper passivation layer 180q such that the overhangs of reflowed thick portion 53 above the openings 188 upper passivation layer 180q may be increased. In one embodiment, the heat treatment may be omitted and the overhangs may be formed by other means (e.g., use of a solvent spray).

Figure 31:
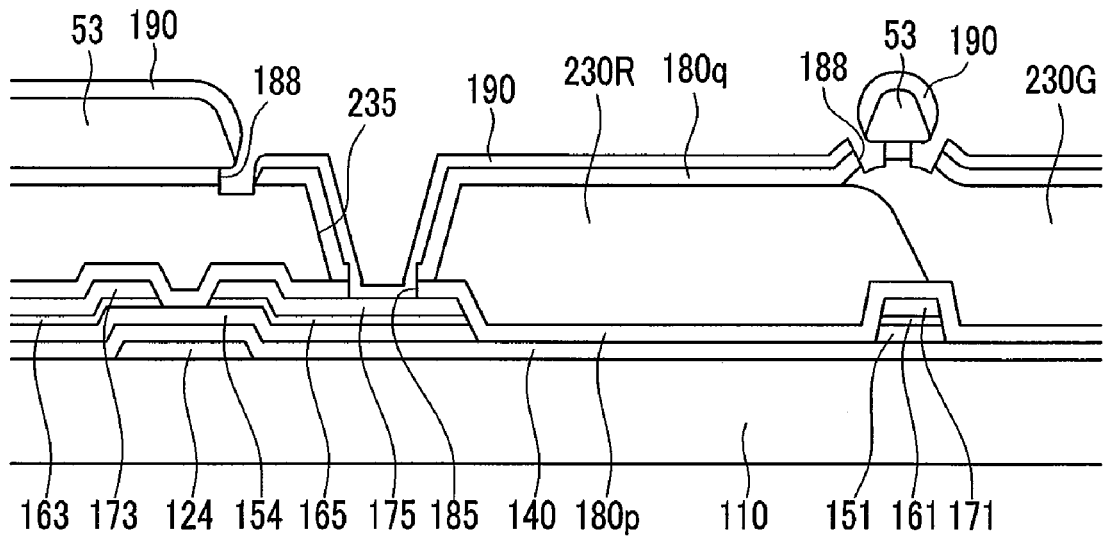
Figure 32:
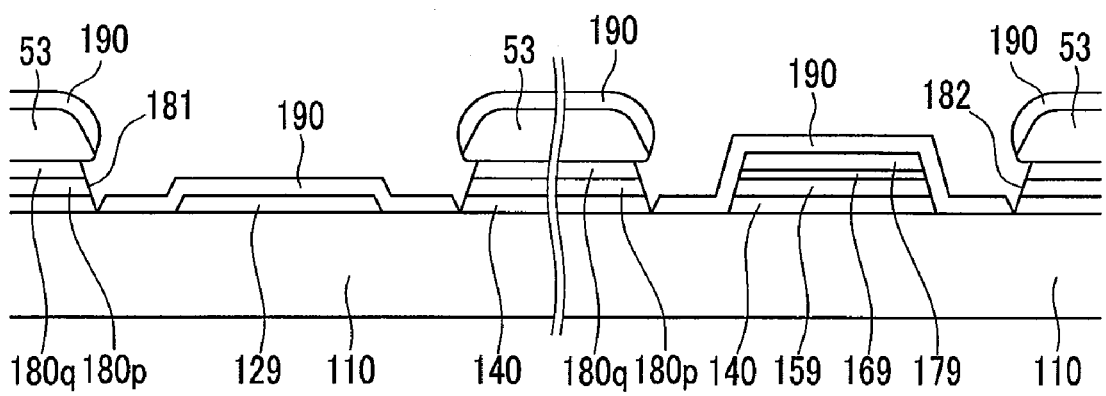

Next, referring to FIG. 31 and FIG. 32, a conductive layer 190 of a transparent conductive material such as ITO or IZO or a reflective metal is deposited on the whole surface of the remaining photosensitive film pattern and the upper passivation layer 180q. Here, the conductive layer 190 will not be deposited in the overhang-covered cutouts 188 of the upper passivation layer 180q. Alternatively, a crack of the conductive layer 190 may be generated at the cutouts 188. Also, the conductive layer 190 may be disconnected at the boundary of the cutouts 188 and the contact holes 181 and 182 due to the overhangs and the steps of the upper passivation layer 180q. That is, at least a portion of the deposited conductive layer 190 may be disconnected around a circumference of the remaining photosensitive film pattern Next, the remaining photosensitive film pattern is removed (e.g., by heat and/or with aid of a selective solvent) so that portions of the conductive layer 190 disposed on the photosensitive film pattern is lifted off together. Here, the lift-off process may be easy because of the cracks and disconnections of the conductive layer 190. Accordingly, as shown in FIG. 1 to FIG. 3, formation of the pixel electrodes 191 and the contact assistants 81 and 82 is completed.

In the above, the number of masked steps was small. According to one mass production manufacturing method of an exemplary embodiment, a display panel in which color filters 230R and 230G are disposed in the thin film transistor array panel may be manufactured using only three photomasks, thereby reducing manufacturing cost and time while reducing chance for errors associated with having more mask patterning steps. By forming cutouts 188 in the upper passivation layer 180q, lift-off process for forming pixel electrodes 191 may become easy and forming pixel electrodes 191 having the desired shape may be possible. By performing heat treatment to the photosensitive film pattern for the lift-off process so that the photosensitive film pattern reflows to form the overhangs, the lift-off process may become easy.

Next, a liquid crystal display according to another exemplary embodiment of the present invention will be described with reference to FIG. 33 to FIG. 47.

Figure 33:
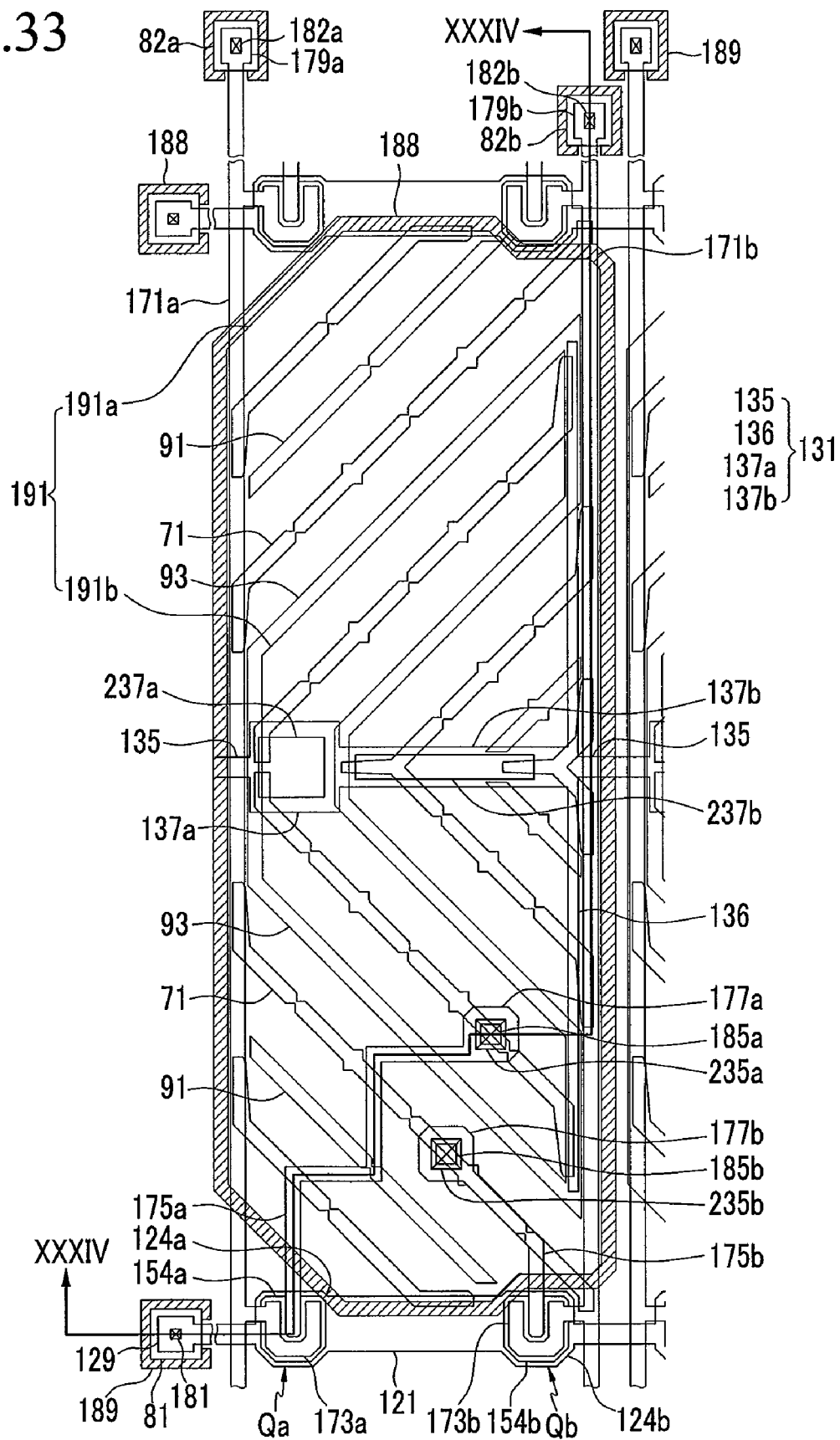
FIG. 33 is a layout view of a liquid crystal display according to an exemplary embodiment.
Figure 34:
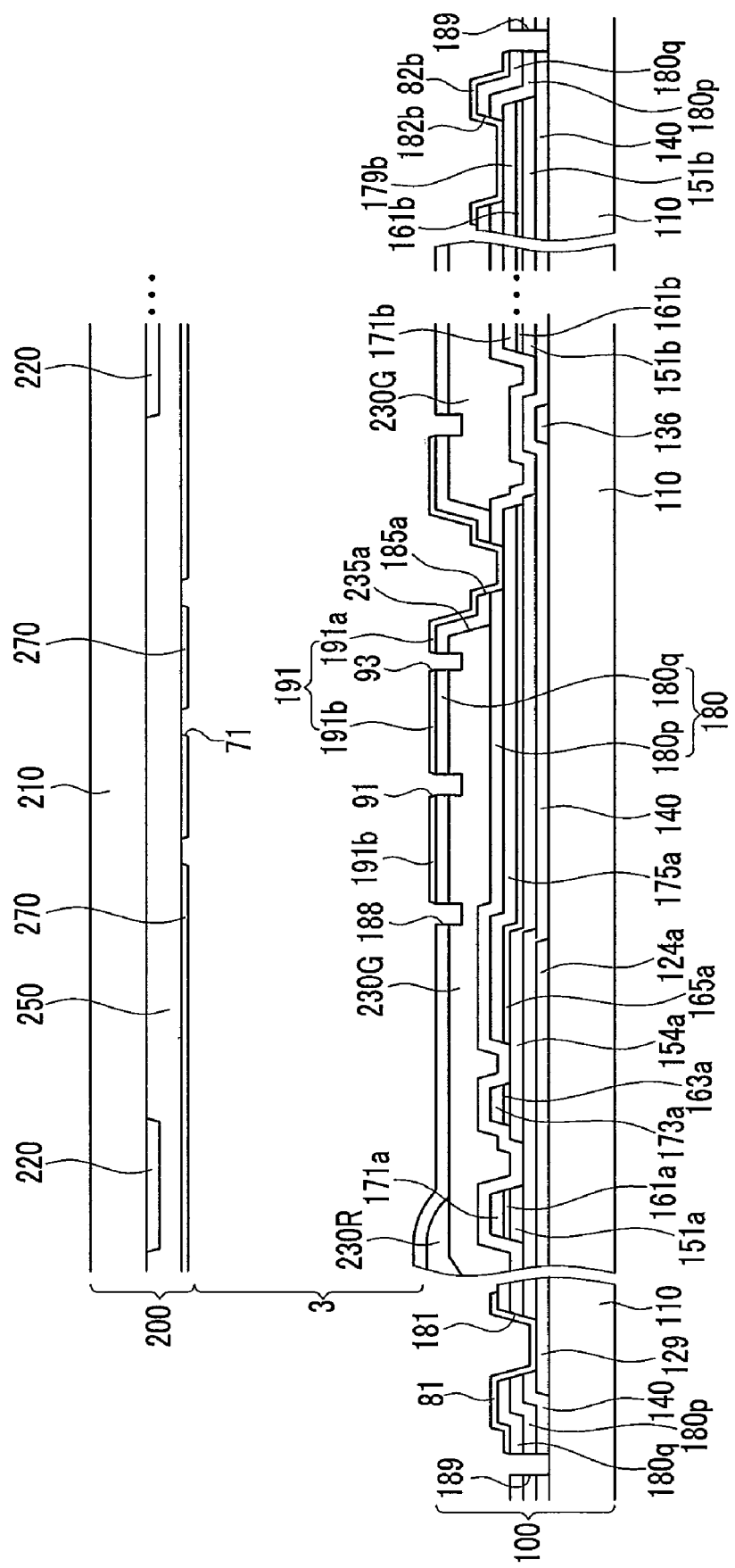
FIG. 34 is a cross-sectional view of the liquid crystal display shown in FIG. 33 taken along the line XXXIV-XXXIV.

FIG. 33 is a layout view of a liquid crystal display according to an exemplary embodiment of the present invention, and FIG. 34 is a cross-sectional view of the liquid crystal display shown in FIG. 33 taken along the line XXXIV-XXXIV.

Referring to FIG. 33 and FIG. 34, the liquid crystal display according to an exemplary embodiment includes a thin film transistor array panel 100 and a common electrode panel 200 facing each other, and a liquid crystal material layer 3 disposed therebetween.

In one embodiment, the liquid crystal layer 3 has negative dielectric anisotropy. The liquid crystal molecules of the liquid crystal layer 3 are arranged such that longitudinal axes of the liquid crystal molecules may be perpendicular to the surfaces of the two panels 100 and 200 in the absence of an electric field.

First, the common electrode panel 200 will be described.

A light blocking member 220 (see FIG. 34) is formed on a light-passing insulation substrate 210, and a light-passing and planarizing overcoat 250 is formed thereon. The overcoat 250 may be made of an (organic) insulating material, and may be omitted in some embodiments.

A common electrode 270 is formed on the overcoat 250. The common electrode 270 may be made of a transparent conductor such as ITO and IZO, and receives a common voltage. The common electrode 270 includes a plurality of cutouts 71. Each of the cutouts 71 has at least one oblique portion substantially obliquely extending, and each slanting portion has a plurality of notches that are concave or convex (see FIG. 33).

Next, the thin film transistor array panel 100 will be described.

The thin film transistor array panel 100 according to the present exemplary embodiment has almost the same cross-sectional structure as the previous exemplary embodiment except that one major difference to be observed is the formation of two TFTs (Qa and Qb) for each pixel unit PX. In the present exemplary embodiment, descriptions of same elements will be omitted, and the same constituent elements as in the above-described exemplary embodiment are indicated by the same reference numerals.

A plurality of gate lines 121 and a plurality of charge storage electrode lines 131 are formed on an insulation substrate 110 (where the storage lines have portions 135, 136, 137a and 137b). Each of the gate lines 121 includes a plurality of first and second gate electrodes 124a and 124b and an end portion 129. The storage electrode lines 131 receive a predetermined voltage and they extend parallel to the gate lines so as to define charge storage capacitors. Each of the storage electrode lines 131 has portions disposed between two neighboring gate lines 121, where these portions include first and second storage electrodes 137a and 137b, a branch electrode 136, and a connection 135. The connection 135 connects a branch electrode 136 to a neighboring first storage electrode 137a.

A gate insulating layer 140 is formed on the gate lines 121 and the storage electrode lines 131, and first and second semiconductor stripes 151a and 151b respectively including protrusions 154a and 154b are formed thereon.

First ohmic contact stripes 161a and first ohmic contact islands 165a are formed on the first semiconductor stripes 151a, and second ohmic contact stripes 161b and second ohmic contact islands (not shown) are formed on the second semiconductors 154b. The first ohmic contact stripes 161a include protrusions 163a facing the first ohmic contact islands 165a on the first gate electrodes 124a, and the second ohmic contact stripes 161b include protrusions (not shown) facing the second ohmic contact islands on the second gate electrode 124b.

A plurality of first and second data lines 171a and 171b including end portions 179a and 179b and a plurality of first and second drain electrodes 175a and 175b including wide portions 177a and 177b are formed on the ohmic contacts 161a, 161b, and 165a and the gate insulating layer 140.

For the two TFTs per pixel, the respective first/second gate electrode 124a/124b, the first/second source electrode 173a/173b, and the first/second drain electrode 175a/175b along with the first/second semiconductor island 154a/154b form the respective first/second thin film transistor Qa/Qb.

A passivation layer 180 including a lower passivation layer 180p and an upper passivation layer 180q is formed on the data lines 171a and 171b, the drain electrodes 175a and 175b, and the exposed semiconductor stripes 151a and 151b. At least one of the lower film 180p and the upper film 180q may be omitted.

The passivation layer 180 has a plurality of contact holes 182a and 182b respectively exposing the end portions 179a and 179b of the data lines 171a and 171b, and a plurality of contact holes 185a and 185b respectively exposing the wide end portions 177a and 177b of the drain electrodes 175a and 175b. The passivation layer 180 and the gate insulating layer 140 have a plurality of contact holes 181 exposing the end portions 129 of the gate lines 121. The passivation layer 180 and the gate insulating layer 140 have furrows (trenches) 189 having a partially opened ring-shape that enclose the circumferences of the end portions 129 of the gate lines 121 and the end portions 179a and 179b of the data lines 171a and 171b with an interval from the end portions 129, 179a and 179b, thereby exposing the substrate 110.

Color filters 230R and 230G are formed between the lower passivation layer 180p and the upper passivation layer 180q. The color filters 230R and 230G have openings 235a and 235b through which the respective drain contact holes 185a and 185b pass, and the openings 235a and 235b are larger than the contact holes 185a and 185b. The color filters 230R and 230G have first openings 237a disposed on the first storage electrodes 137a and second openings 237b disposed on the second storage electrodes 137b.

On the other hand, the upper passivation layer 180q has a plurality of cutouts 188 exposing the color filters 230R and 230G. The cutouts 188 are approximately formed along the boundary of pixel regions defined by the gate lines 121 and data lines 171a and 171b. The upper surface of the color filters 230R and 230G disposed under the cutouts 188 may be thinly removed along the cutouts 188.

A plurality of pixel electrodes 191 and a plurality of contact assistants 81, 82a and 82b are formed on the upper passivation layer 180q of the passivation layer 180. Most of the pixel electrodes 191 and the contact assistants 81, 82a, and 82b except for the contact holes 185a and 185b are disposed on the upper passivation layer 180q.

The outer boundary of the contact assistants 81, 82a, and 82b may accord with the inner boundary of the furrows 189.

The pixel electrode structure 191 of each pixel PX includes a first subpixel electrode 191a and a second subpixel electrode 191b, and the area of the first subpixel electrode 191a is smaller than the area of the second subpixel electrode 191b.

The first sub-pixel electrode 191a has a shape of the sign "<" and is enclosed by the second sub-pixel electrode 191b via a gap 93 formed therebetween. The second sub-pixel electrode 191b includes a plurality of cutouts 91 with a straight bend shape and forms an angle of about 45 degrees with respect to the gate lines 121 and the data lines 171a and 171b. The gap 93 includes a plurality of oblique portions that are parallel to the cutouts 91 and a plurality of longitudinal portions that are parallel to the data lines 171a and 171b. The cutouts 91 and the gap 93 are alternately arranged with the cutouts 71 of the common electrode 270 as shown in FIG. 33, and the cutouts 188 of the upper passivation layer 180q are disposed under the cutout 91 and gap 93.

The first sub-pixel electrodes 191a form a storage capacitor by overlapping the first storage electrode 137a at the first opening 237a. The second sub-pixel electrodes 191b form a storage capacitor by overlapping the second storage electrode 137b at the second opening 237b.

The respective first/second sub-pixel electrode 191a/191b is connected to the first/second drain electrode 175a/175b of the first/second thin film transistor through the contact hole 185a/185b such that it receives a data voltage from the first/second drain electrode 175a/175b. The first/second sub-pixel electrode 191a/191b applied with the data voltage generates an electric field along with the common electrode 270 of the common electrode panel 200 such that the orientation of the liquid crystal molecules of the liquid crystal layer 3 between the electrodes 191a/191b and 270 is determined. Accordingly, luminance of light passing through the liquid crystal layer 3 depends on such determined orientation of the liquid crystal molecules.

Next, a manufacturing of a thin film transistor array panel 100 of the liquid crystal display shown in FIG. 33 and FIG. 34 according to an exemplary embodiment will be described with reference to FIG. 35 to FIG. 47 as well as FIG. 33 and FIG. 34.

Figure 35:
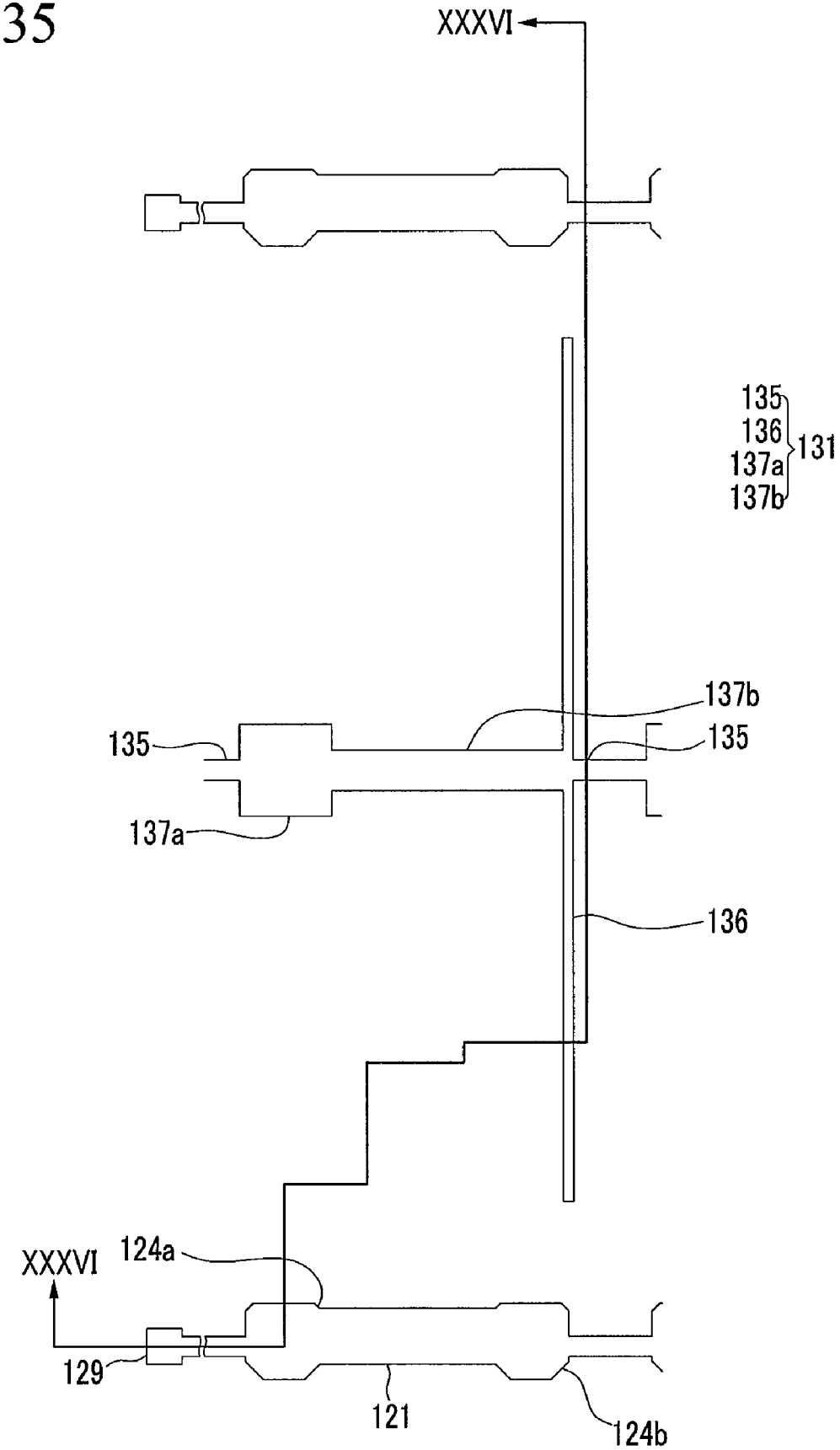
FIG. 35, FIG. 37, and FIG. 41 are layout views showing intermediate steps of a manufacturing process of the thin film transistor array panel of the liquid crystal display shown in FIG. 33 according to an exemplary embodiment.
Figure 36:
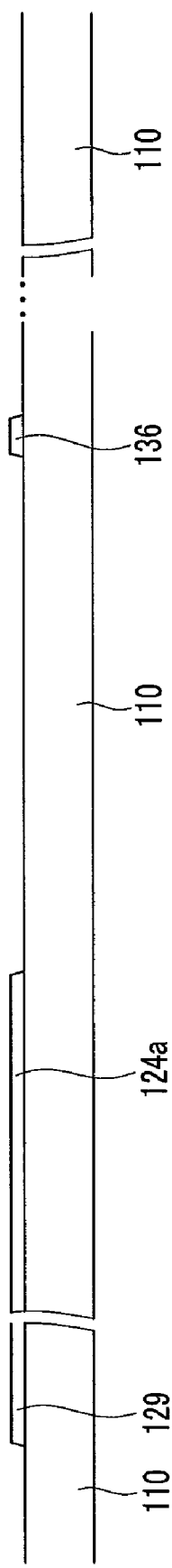
FIG. 36, FIG. 38 to FIG. 40, and FIG. 42 to FIG. 47 are cross-sectional views showing intermediate steps of a mass production manufacturing process of the thin film transistor array panel of the liquid crystal display shown in FIG. 33 according to an exemplary embodiment, these showing the thin film transistor array panels shown in FIG. 35, FIG. 37, and FIG. 41 taken along the lines XXXVI-XXXVI, XXXVIII-XXXVIII, and XLII-XLII, respectively.
Figure 37:
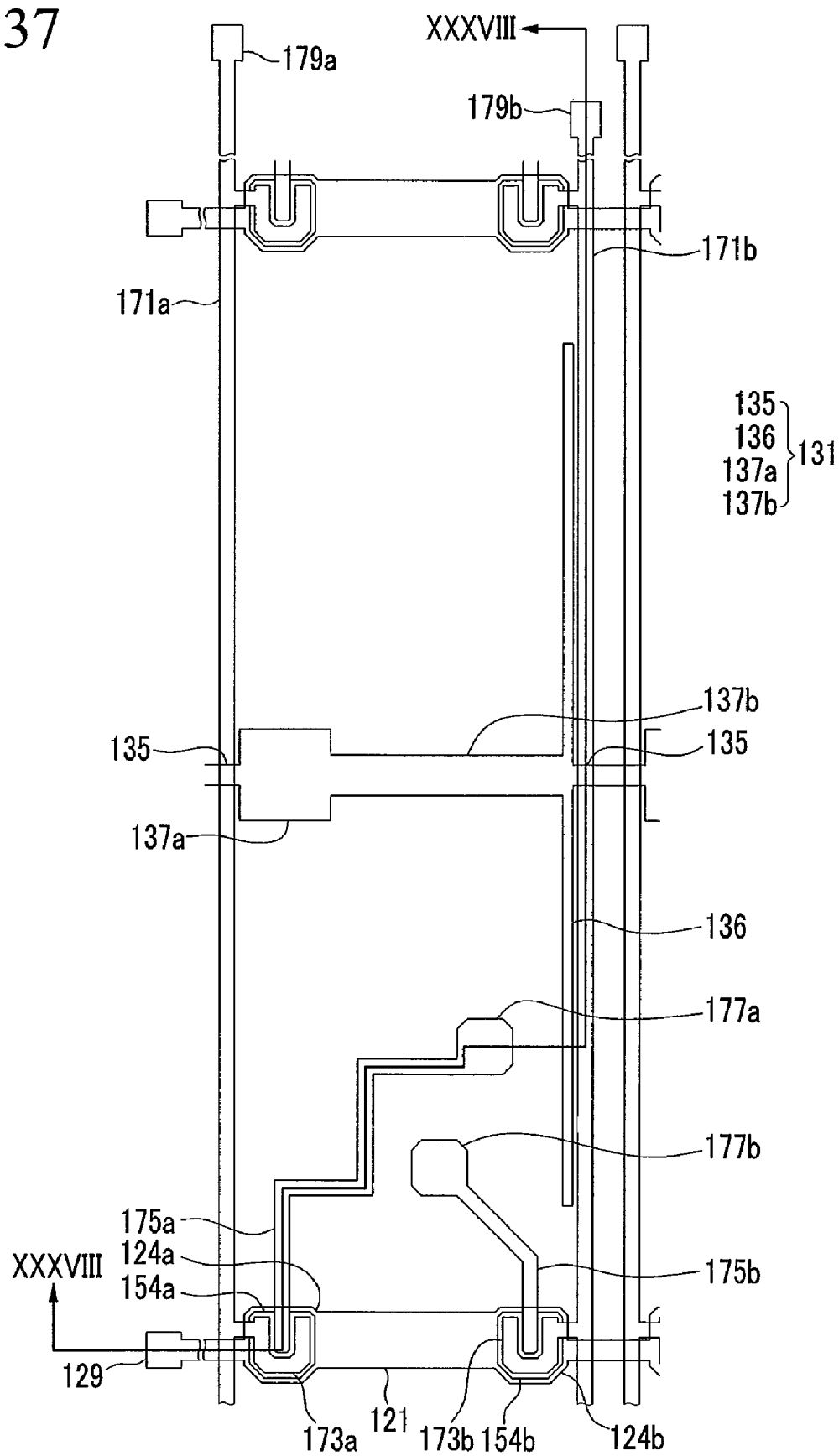
Figure 39:
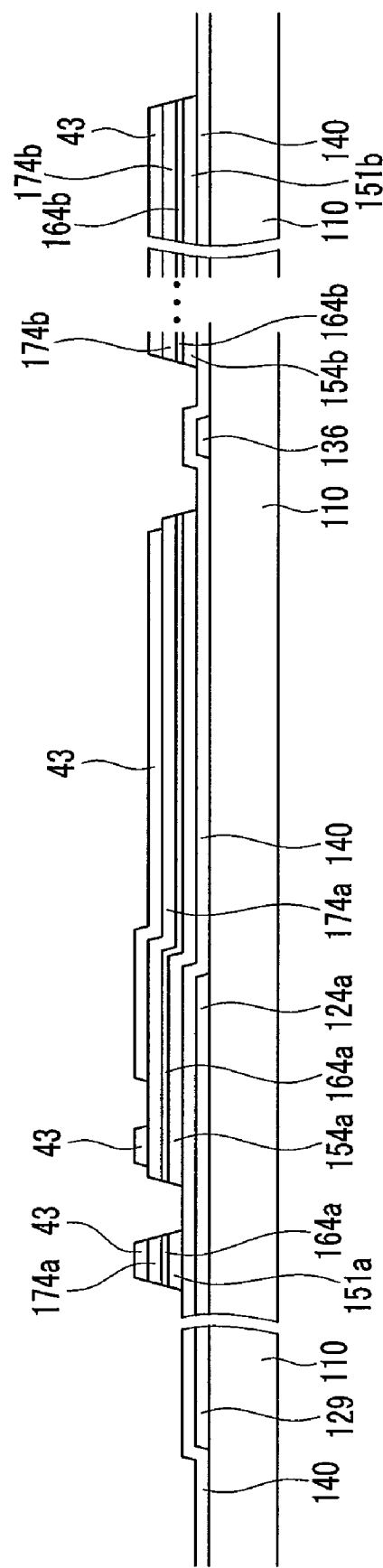
Figure 40:
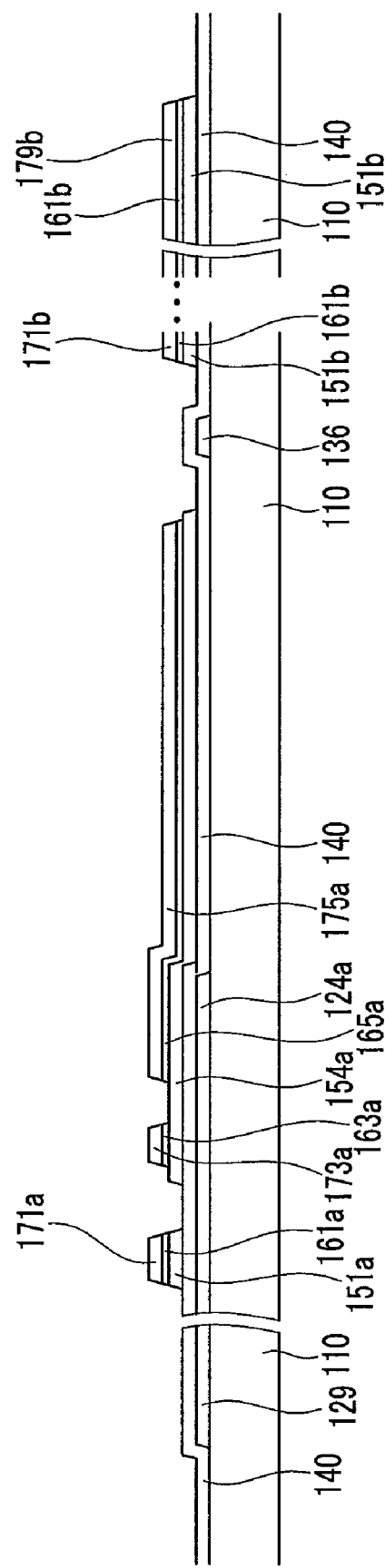
Figure 41:
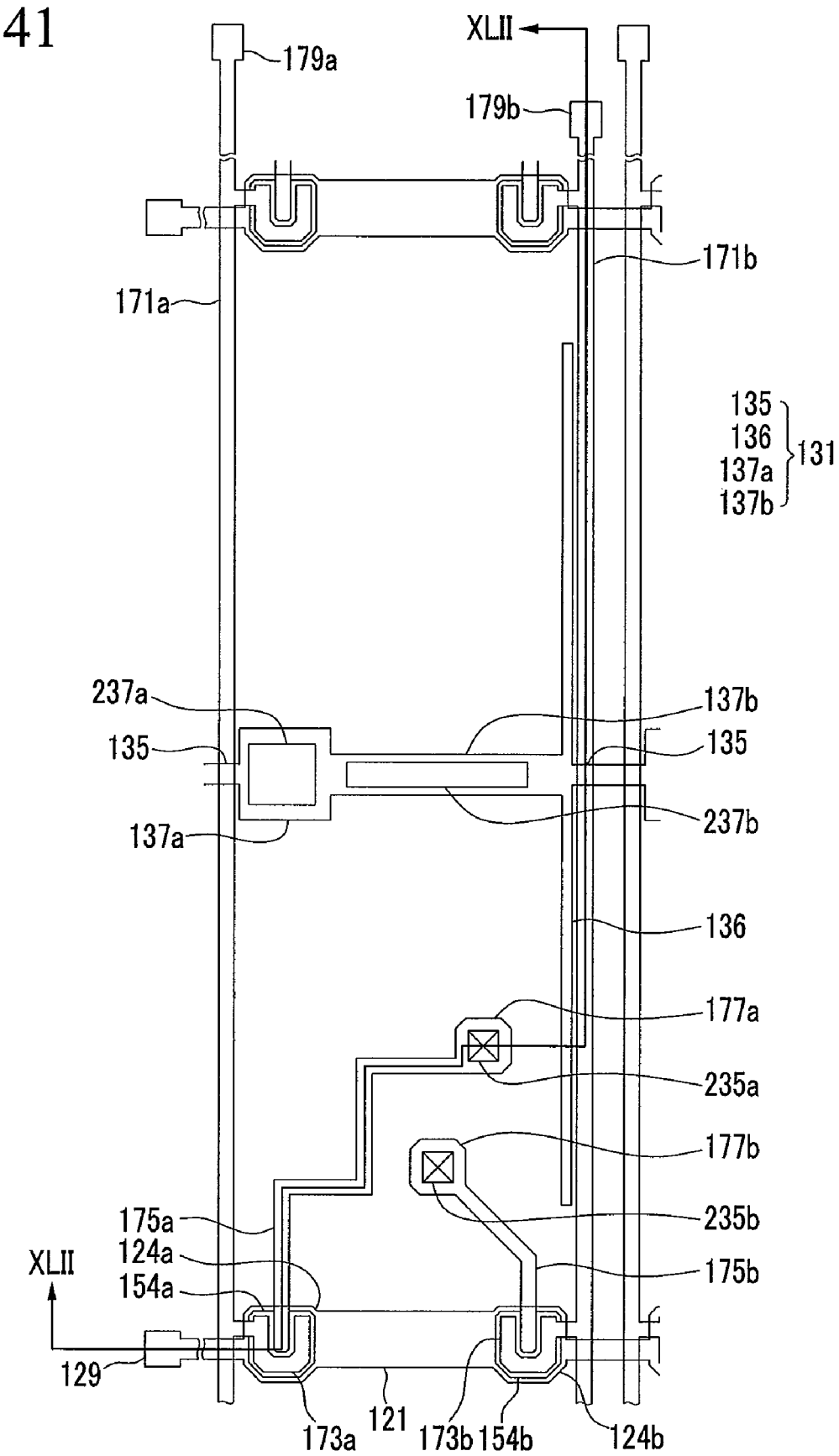

FIG. 35, FIG. 37, and FIG. 41 are layout views showing intermediate steps of a manufacturing process of the thin film transistor array panel of the liquid crystal display shown in FIG. 33 according to an exemplary embodiment, and FIG. 36, FIG. 38 to FIG. 40, and FIG. 42 to FIG. 47 are cross-sectional views showing intermediate steps of a manufacturing process of the thin film transistor array panel of the liquid crystal display shown in FIG. 33 according to an exemplary embodiment of the present invention and showing the thin film transistor array panel shown in FIG. 35, FIG. 37, and FIG. 41 taken along the lines XXXVI-XXXVI, XXXVIII-XXXVIII, and XLII-XLII, respectively.

Referring to FIG. 35 and FIG. 36, a gate-lines defining conductive layer (not shown) is deposited on an insulation substrate 110 and patterned by photolithography to form a plurality of gate lines 121 including first and second gate electrodes 124a and 124b and wide end portions 129, and a plurality of storage electrode lines 131 including first and second storage electrodes 137a and 137b, a branch electrode 136, and a connection 135.

Figure 38:
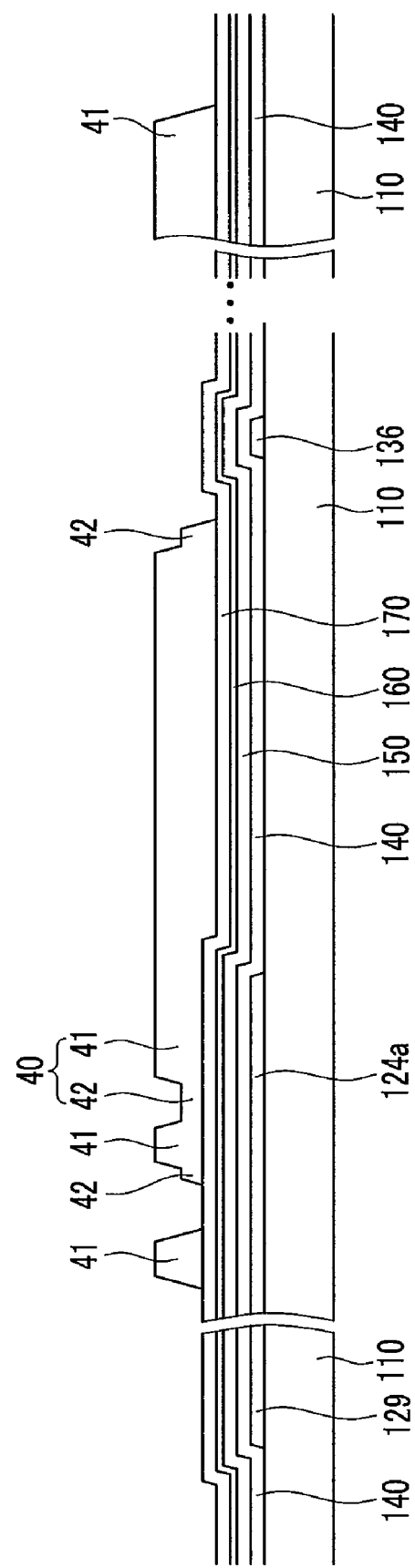

Next, referring to FIG. 37 and FIG. 38, a gate insulating layer 140, an intrinsic semiconductor layer 150, an impurity-doped semiconductor layer 160, and a data-lines defining conductive layer 170 are sequentially deposited on the gate lines 121 and the storage electrode lines 131, and the substrate 110.

Next, a photosensitive film (not shown) is coated on the data-lines defining conductive layer 170 and exposed to light and developed to form a photosensitive film pattern 40 including a thick portion 41 and a thinner portion 42. The formation method of the photosensitive film pattern 40 is the same as the previous exemplary embodiment and thus details are omitted here.

Next, referring to FIG. 39, the data-lines defining conductive layer 170, the impurity-doped semiconductor layer 160, and the intrinsic semiconductor layer 150 are etched using the photosensitive film pattern 40 as an etch mask to form a plurality of data conductor layers 174a and 174b, a plurality of ohmic contact layers 164a and 164b, and a plurality of first and second semiconductor stripes 151a and 151b including protrusions 154a and 154b.

Next, the whole surface of the photosensitive film pattern 40 is blanket etched until the thinner portion 42 is removed to form a photosensitive film pattern 43.

Next, referring to FIG. 40, the data conductor layers 174a and 174b and the ohmic contact layers 164a and 164b are etched using the photosensitive film pattern 43 as an etch mask to form a plurality of pairs of first and second data lines 171a and 171b including source electrodes 173a and 173b and end portions 179a and 179b, a plurality of first and second drain electrodes 175a and 175b, a plurality of ohmic contact stripes 161a including protrusions 163a, a plurality of ohmic contact stripes 161b, and a plurality of ohmic contact islands 165a.

Figure 42:
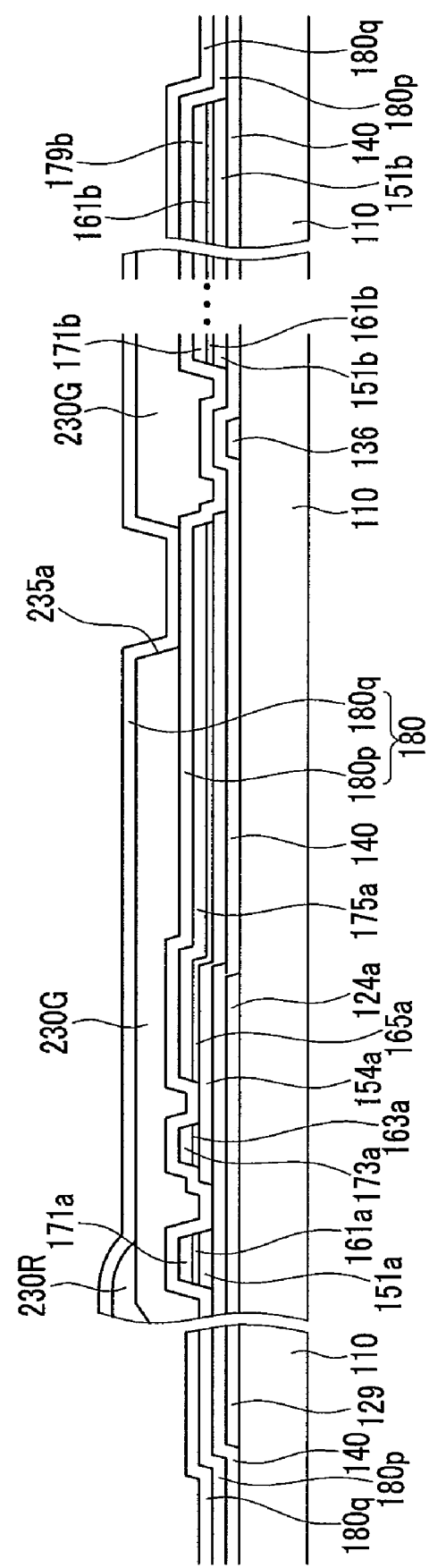

Referring FIG. 41 and FIG. 42, the photosensitive film pattern 43 is removed and a lower passivation layer 180p is deposited on the whole surface, and color filters 230R and 230G having respective openings 235a and 235b are formed.

Next, an upper passivation layer 180q is formed on the color filters 230R and 230G.

Figure 43:
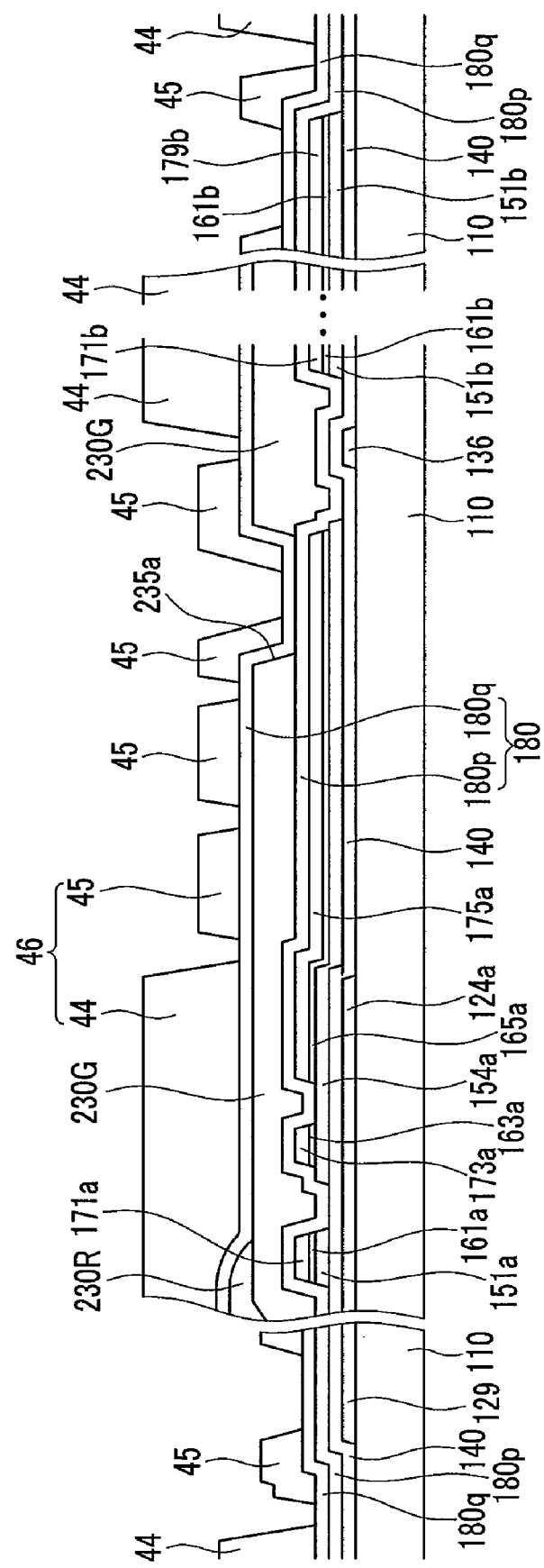

Referring to FIG. 43, a photosensitive film pattern 46 including a thick portion 44 and a thinner portion 45 is formed on the upper passivation layer 180q. In the present exemplary embodiment, the photosensitive film pattern 46 also includes a portion where the photosensitive film does not exist such as the portions between the thick portion 53 and the thinner portion 54. The formation method of the photosensitive film pattern 46 is essentially the same as the previous exemplary embodiment such that details thereof are omitted here.

Figure 44:
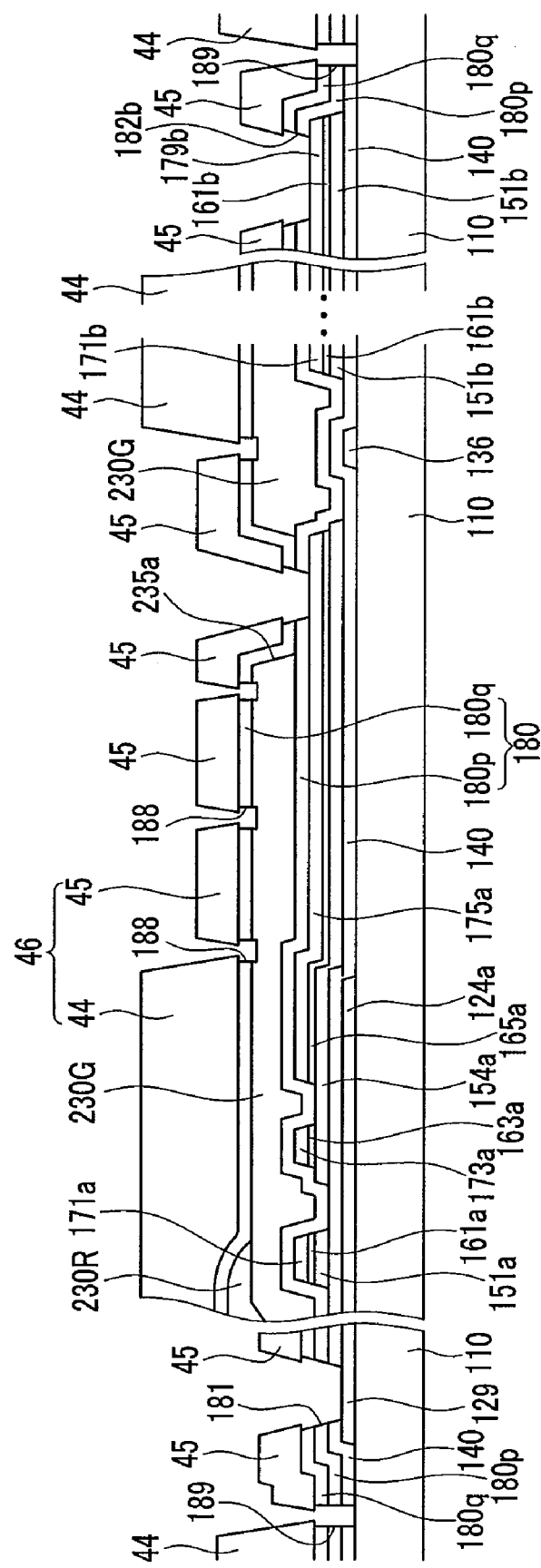

Next, referring to FIG. 44, the upper passivation layer 180q, the lower passivation layer 180p, and the gate insulating layer 140 are etched using the photosensitive film pattern 46 as an etch mask. Accordingly, overhung cutouts 188 of the upper passivation layer 180q, contact holes 181, 182a, 182b, 185a, and 185b, and furrows 189 exposing the substrate 110 are formed.

Here, the upper passivation layer 180q, the lower passivation layer 180p, and the gate insulating layer 140 may be overetched inside the boundary of the photosensitive film pattern 46, thereby forming an undercut. Also, the color filters 230R and 230G exposed by the cutouts 188 of the upper passivation layer 180q may be slightly removed.

Figure 45:
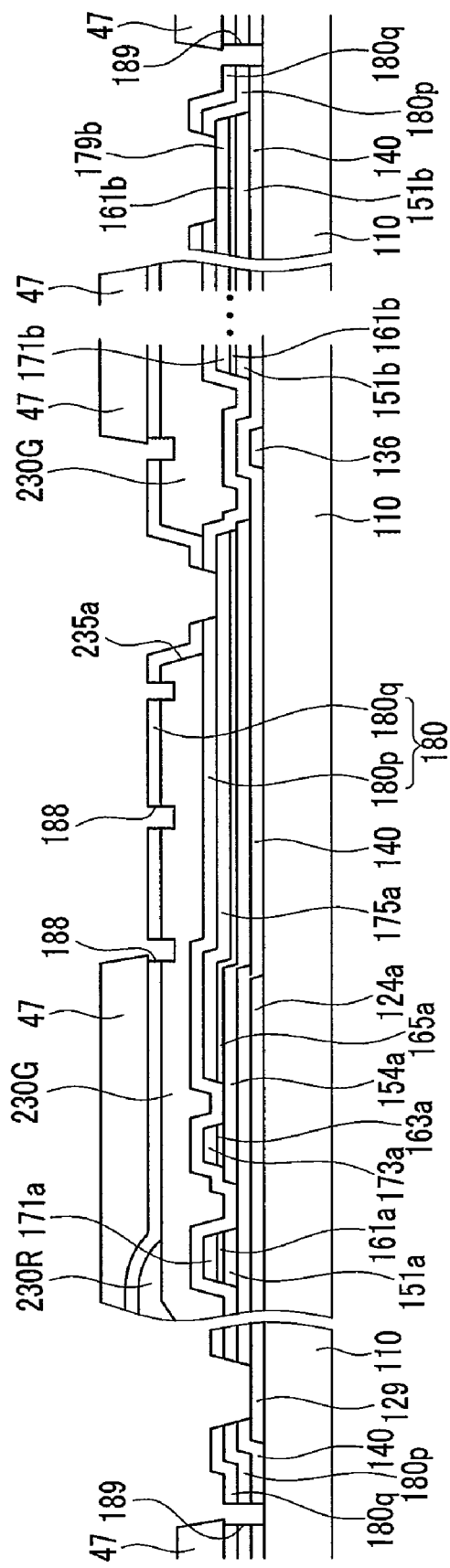

Next, referring to FIG. 45, the whole surface of the photosensitive film pattern 46 is etched until the thin portion 45 is removed to form a photosensitive film pattern 47.

Figure 46:
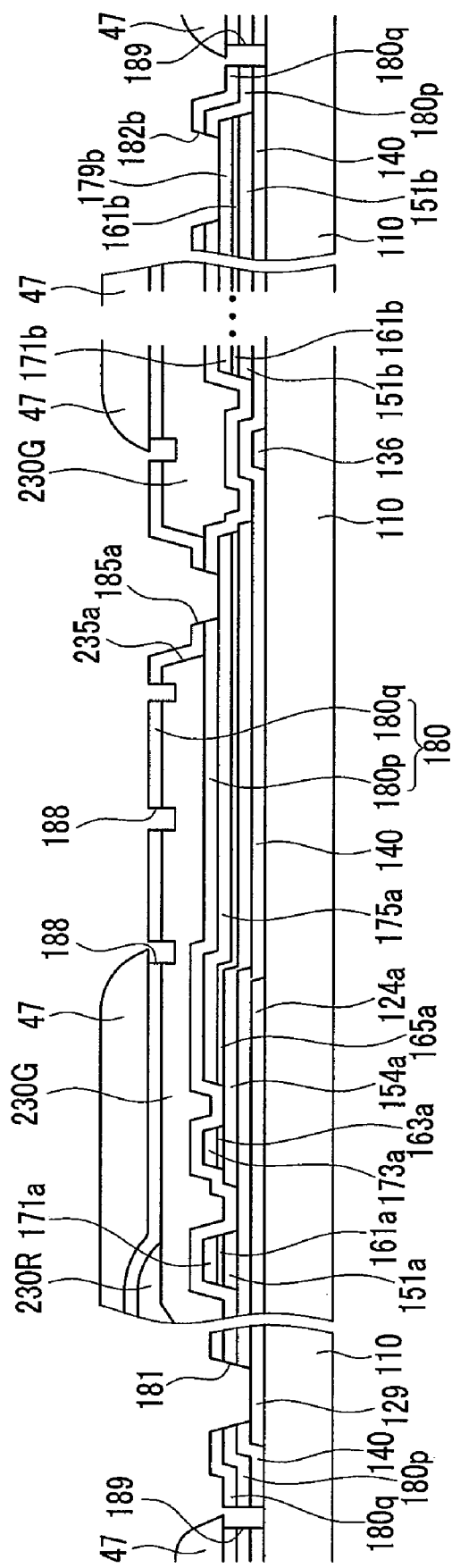

Next, referring to FIG. 46, the photosensitive film pattern 47 is subjected to heat treatment or baking so that the photosensitive film pattern 47 reflows, and accordingly, the overhangs of the cutouts 188 and of the furrows (trenches) 189 of the upper passivation layer 180q may become enlarged.

Figure 47:
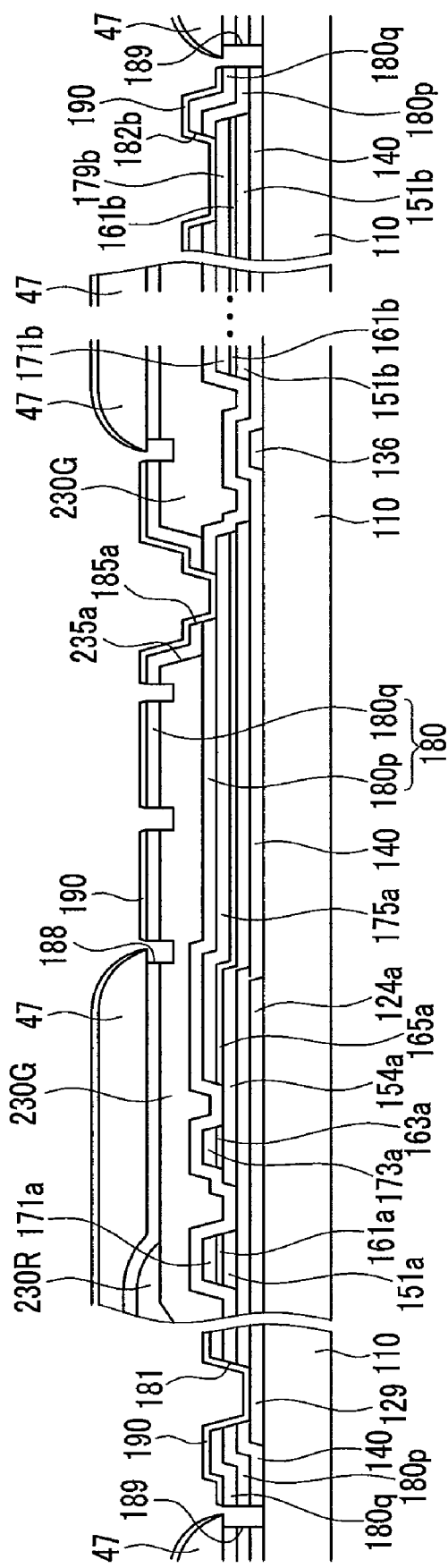

Next, referring to FIG. 47, a conductive layer 190 is deposited on the whole surface including the photosensitive film pattern 47 and the upper passivation layer 180q, and the photosensitive film pattern 47 is removed, thereby lifting off the conductive layer 190 deposited on the photosensitive film pattern 47. Here, a crack of the conductive 190 may be generated at the overhung cutouts 188 and furrows 189 such that the lift-off process of the conductive layer 190 may be made easy. Accordingly, pixel electrodes 191 each including cutouts 91 and a gap 93, and a plurality of contact assistants 81, 82a, and 82b, are formed. Here, the conductive layer 190 does not exist on the areas of the cutouts 188 of the upper passivation layer 180q such that the cutouts 91 and the gap 93 of the pixel electrode 191 may be formed.

Various characteristics and effects of the previous exemplary embodiment may be applied to the manufacturing method of the thin film transistor array panel according to the present exemplary embodiment shown in FIG. 35 to FIG. 47.

According to an exemplary embodiment of the present disclosure, a manufacturing process of a liquid crystal display including color filters disposed in a thin film transistor array panel may be simplified. Also, by forming overhung cutouts in the upper passivation layer, a self-patterning lift-off process for the pixel electrodes may be further simplified.

While this invention has been described in connection with what is presently considered to be practical exemplary embodiments, it is to be understood that the teachings of the present disclosure are not limited to the specifically disclosed embodiments, but, on the contrary, they are intended to cover various modifications and equivalent arrangements that are in accordance with the spirit and scope of the teachings.

What is claimed is:

1. A method for manufacturing a thin film transistor array panel, the method comprising:
forming a thin film transistor on top of a light-passing substrate;
forming a color filter on the thin film transistor;
depositing a first passivation layer on the color filter;
forming a first photosensitive film on the first passivation layer and causing the first photosensitive film to have a first photosensitive film pattern that comprises a first portion and comprises a second portion that is thicker than the first portion, the first photosensitive film pattern exposing the first passivation layer around a circumference of the second portion;
removing the exposed first passivation layer using the first photosensitive film pattern as an etch mask;
blanket etching a whole surface of the first photosensitive film pattern until the thinner first portion is removed while part of the comparatively thicker second portion remains to thereby form a second photosensitive film pattern;
depositing a conductive layer on the second photosensitive film pattern; and
removing the second photosensitive film pattern to thereby lift off correspondingly supported parts of the conductive layer and thus form a pixel electrode with a left behind portion of the conductive layer.

2. The method of claim 1, wherein the second photosensitive film pattern comprises a third portion where the photosensitive film remains, and in depositing of the conductive layer on the second photosensitive film pattern, at least a portion of the deposited conductive layer becomes discontinuous around a circumference of the third portion.

3. The method of claim 1, wherein the causing of the first photosensitive film to have the first and second portions of different thicknesses includes: using a first photomask to pattern the first photosensitive film where the first photomask comprises a first transparent portion transmitting light, a first opaque portion blocking light, and a first translucent portion that corresponds to the first portion and partially transmits light.

4. The method of claim 3, wherein the first translucent portion comprises at least one of a slit pattern of a lattice shape and a translucent layer.

5. The method of claim 1, wherein the formation of the thin film transistor comprises: forming a gate line on the substrate; forming a gate insulating layer on the gate line; forming a semiconductive layer defining a transistor channel region on the gate insulating layer; forming above the semiconductive layer, a data line having a source electrode extending therefrom, and forming at a same level as the data line and source electrode, a drain electrode.

6. The method of claim 5, wherein the forming of the semiconductive layer, the data line, and the drain electrode comprises using a second photomask.

7. The method of claim 6, wherein the forming of the semiconductive layer, the data line, and the drain electrode comprises: sequentially depositing an intrinsic semiconductor layer, a impurity-doped semiconductor layer, and a data-lines defining conductive layer on the gate insulating layer; coating a second photosensitive film on the data-lines defining conductive layer and causing the second photosensitive film to have a third photosensitive film pattern comprising a fourth portion corresponding to the transistor channel region eand a fifth portion that is thicker than the fourth portion; etching the data-lines defining conductive layer, the impurity-doped semiconductor layer, and the semiconductor layer using the third photosensitive film pattern as an etch mask; blanket etching a whole surface of the third photosensitive film pattern until the fourth portion is removed to thereby form a fourth photosensitive film pattern; and etching the data-lines defining conductive layer and the impurity-doped semiconductor layer using the fourth photosensitive film pattern.

8. The method of claim 7, wherein said causing of the second photosensitive film to define the third photosensitive film pattern comprises: using a second photomask where the second photomask comprises a second transparent portion transmitting light, a second opaque portion blocking light, and a second translucent portion partially transmitting light.

9. The method of claim 1, further comprising forming a second passivation layer on the substrate before forming of the color filter, the second passivation layer underlying the color filter.

10. The method of claim 1, wherein the thin film transistor comprises a gate line comprising a gate electrode and an end portion; a gate insulating layer disposed on the gate line; a semiconductive layer disposed on the gate insulating layer; and a data layer comprising a source electrode and an end portion and a drain electrode, where the source electrode and the drain electrode are disposed on the semiconductive layer.

11. The method of claim 10, wherein the color filter has defined therethrough, an opening disposed over a portion of the drain electrode, and the first photosensitive film pattern exposes the first passivation layer by way of the opening.

12. The method of claim 10, wherein the first photosensitive film pattern exposes the first passivation layer disposed on at least a portion of the end portion of the gate line and at least a portion of the end portion of the data line, and forming of the pixel electrode further comprises forming contact assistants respectively connected to the end portions of the data line and the gate line.

13. The method of claim 12, wherein said etching of the exposed first passivation layer using the first photosensitive film pattern as the etch mask further comprises etching the gate insulating layer using the first photosensitive film pattern as an etch mask.

14. The method of claim 13, wherein in etching of the gate insulating layer using the first photosensitive film pattern as the etch mask, the substrate around the end portion of the gate line or the end portion of the data line is exposed.

15. The method of claim 13, wherein the first portion of the first photosensitive film pattern comprises a portion overlapping at least a portion of an edge of the end portion of the gate line or of the end portion of the data line and the second portion of the first photosensitive film pattern comprises a portion neighboring the first portion with a gap.

16. The method of claim 1, further comprising forming a second passivation layer on the substrate before forming of the color filter.

17. The method of claim 1, wherein the second photosensitive film pattern is reflowed by heating the second photosensitive film before removing of the second photosensitive film pattern and the reflow forms or increases overhang structures.

18. The method of claim 1, wherein the exposed portion of the first passivation layer by the first photosensitive film pattern around the circumference of the second portion has a belt shape.

* * * * *